(12) United States Patent
Shaeffer et al.

(10) Patent No.: US 12,159,574 B2
(45) Date of Patent: Dec. 3, 2024

(54) LOCAL PASSIVE MATRIX DISPLAY

(71) Applicant: Apple Inc., Cupertino, CA (US)

(72) Inventors: Derek K. Shaeffer, Redwood City, CA (US); Mahdi Farrokh Baroughi, Santa Clara, CA (US); Xiaofeng Wang, San Jose, CA (US); Sam S. Li, Sunnyvale, CA (US); John T. Wetherell, San Jose, CA (US); Henry C. Jen, Los Altos, CA (US); Xiang Lu, Campbell, CA (US); Hasan Akyol, Mountain View, CA (US); Hopil Bae, Sunnyvale, CA (US); Xiang Fang, Cupertino, CA (US); Hjalmar Edzer Ayco Huitema, Belmont, CA (US); Tore Nauta, Santa Cruz, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/295,619

(22) Filed: Apr. 4, 2023

(65) Prior Publication Data

US 2023/0316998 A1    Oct. 5, 2023

Related U.S. Application Data

(63) Continuation of application No. 17/648,074, filed on Jan. 14, 2022, now Pat. No. 11,645,976, which is a
(Continued)

(51) Int. Cl.
*G09G 3/3216*    (2016.01)
*G09G 3/20*    (2006.01)
(Continued)

(52) U.S. Cl.
CPC ......... *G09G 3/3216* (2013.01); *G09G 3/2003* (2013.01); *H05B 45/20* (2020.01);
(Continued)

(58) Field of Classification Search
CPC .. G06F 3/1446; G09G 3/2003; G09G 3/2085; G09G 3/32; G09G 3/3216; G09G 3/3266;
(Continued)

(56) References Cited

U.S. PATENT DOCUMENTS 10,380,952 B2    8/2019    Sakariya et al.
11,263,963 B2    3/2022    Shaeffer et al.
(Continued)

FOREIGN PATENT DOCUMENTS

CN    107403603 A    11/2017
EP    1079362 A2    2/2001
(Continued)

OTHER PUBLICATIONS

PCT/US2019/028779, Invitation to Pay Additional Fees and, Where Applicable, Protest Fee, mailed Jul. 15, 2019, 17 pgs.
(Continued)

*Primary Examiner* — Stacy Khoo
(74) *Attorney, Agent, or Firm* — Aikin & Gallant, LLP

(57) ABSTRACT

Local passive matrix displays and methods of operation are described. In an embodiment, the display includes a pixel driver chip coupled with a matrix of rows and columns of LEDs. The pixel driver chips may be arranged in rows across the display with separate portions to operate separate matrices of LEDs.

14 Claims, 35 Drawing Sheets

Related U.S. Application Data continuation of application No. 16/272,492, filed on Feb. 11, 2019, now Pat. No. 11,263,963.

(60) Provisional application No. 62/669,293, filed on May 9, 2018.

(51) Int. Cl.
  *H05B 45/20* (2020.01)
  *H10K 59/17* (2023.01)

(52) U.S. Cl.
  CPC ..... *H10K 59/17* (2023.02); *G09G 2310/0243* (2013.01); *G09G 2310/0264* (2013.01)

(58) Field of Classification Search
  CPC ..... G09G 2300/026; G09G 2300/0426; G09G 2310/0243; G09G 2310/0264; G09G 2310/0278; G09G 2310/08; G09G 2330/025; H01L 27/3255; H01L 27/3281; H05B 45/20
  See application file for complete search history.

(56) References Cited

U.S. PATENT DOCUMENTS

| | | | |
|---|---|---|---|
| 11,645,976 | B2 | 5/2023 | Shaeffer et al. |
| 2002/0142504 | A1 | 10/2002 | Feldman et al. |
| 2003/0141807 | A1 | 7/2003 | Kawase |
| 2009/0322649 | A1 | 12/2009 | Hamer et al. |
| 2010/0123694 | A1 | 5/2010 | Cok et al. |
| 2010/0207848 | A1 | 8/2010 | Cok |
| 2010/0277440 | A1 | 11/2010 | Cok |
| 2010/0328196 | A1 | 12/2010 | Cok |
| 2014/0035798 | A1 | 2/2014 | Kawada et al. |
| 2015/0310800 | A1 | 10/2015 | Lu et al. |
| 2017/0025075 | A1 | 1/2017 | Cok et al. |
| 2018/0218668 | A1 | 8/2018 | Aoyagi et al. |
| 2021/0366349 | A1 | 11/2021 | Sakariya et al. |

FOREIGN PATENT DOCUMENTS

| | | | |
|---|---|---|---|
| EP | 2927900 | A1 | 10/2015 |
| JP | 2002-268587 | A | 9/2002 |
| JP | 2004-518994 | | 6/2004 |
| JP | 2005-257757 | A | 9/2005 |
| JP | 2010217344 | A | 9/2010 |
| JP | 2012-508900 | A | 4/2012 |
| JP | 2012525608 | A | 10/2012 |
| KR | 20110044289 | A | 4/2011 |
| KR | 20110098912 | A | 9/2011 |
| KR | 20140019222 | A | 2/2014 |
| WO | 2010019183 | A1 | 2/2010 |
| WO | 2010056289 | A | 5/2010 |
| WO | 2010093855 | A2 | 8/2010 |
| WO | 2010096341 | A1 | 8/2010 |
| WO | 2010126954 | A2 | 11/2010 |
| WO | 20120050586 | A1 | 4/2012 |
| WO | 2015/151798 | A | 10/2015 |
| WO | 2016196390 | A1 | 12/2016 |
| WO | 2016200635 | A1 | 12/2016 |

OTHER PUBLICATIONS

PCT/US2019/028779, Notification of Transmittal of the International Search Report and the Written Opinion of the International Searching Authority, mailed Sep. 17, 2019, 23 pages.

LOCAL PASSIVE MATRIX DISPLAY

RELATED APPLICATIONS

This application is a continuation of co-pending U.S. patent application Ser. No. 17/648,074, filed Jan. 14, 2022, which is a continuation of U.S. application Ser. No. 16/272,492 filed Feb. 11, 2019, which claims the benefit of priority from U.S. Provisional Application No. 62/669,293 filed May 9, 2018. The full disclosures of U.S. Provisional Application No. 62/669,293 and U.S. application Ser. No. 16/272,492 are incorporated herein by reference.

BACKGROUND

Field

Embodiments described herein relate to a display system, and more specifically to passive matrix displays and methods of operation.

Background Information

Display panels are utilized in a wide range of electronic devices. Common types of display panels include active matrix display panels where each pixel element, e.g. light emitting diode (LED), may be individually driven to display a data frame, and passive matrix display panels where rows and columns of pixel elements may be driven in a data frame. Both active and passive matrices have been proposed for the fabrication of tiled displays, where display panel dimensions are larger than the limitations imposed on substrate and equipment size restrictions.

SUMMARY

Local passive matrix displays and methods of operation are described. In an embodiment, the display includes a pixel driver chip coupled with a matrix of rows and columns of LEDs. The pixel driver chips may be arranged in rows across the display with each pixel driver chip having separate portions to operate separate matrices of LEDs. In one configuration, a portion of each pixel driver chip is by default active to control a corresponding matrix. In another configuration, both portions of a pixel driver chip are by default active to control a plurality of corresponding matrices. In such a configuration, rows of pixel driver chips may be arranged in rows of primary (active) pixel driver chips and redundant (inactive) pixel driver chips. The displays in accordance with embodiments may be fabricated with curved edges of the display area, and reduced distance (border) between the display area edge and display substrate edge. In some embodiments this may be facilitated by distributed row driver chips among the pixel driver chips in the display area. The distribution of row driver chips may additionally facilitate the arrangement of tiled displays, and cutouts from the display area.

DETAILED DESCRIPTION

Figure 1:
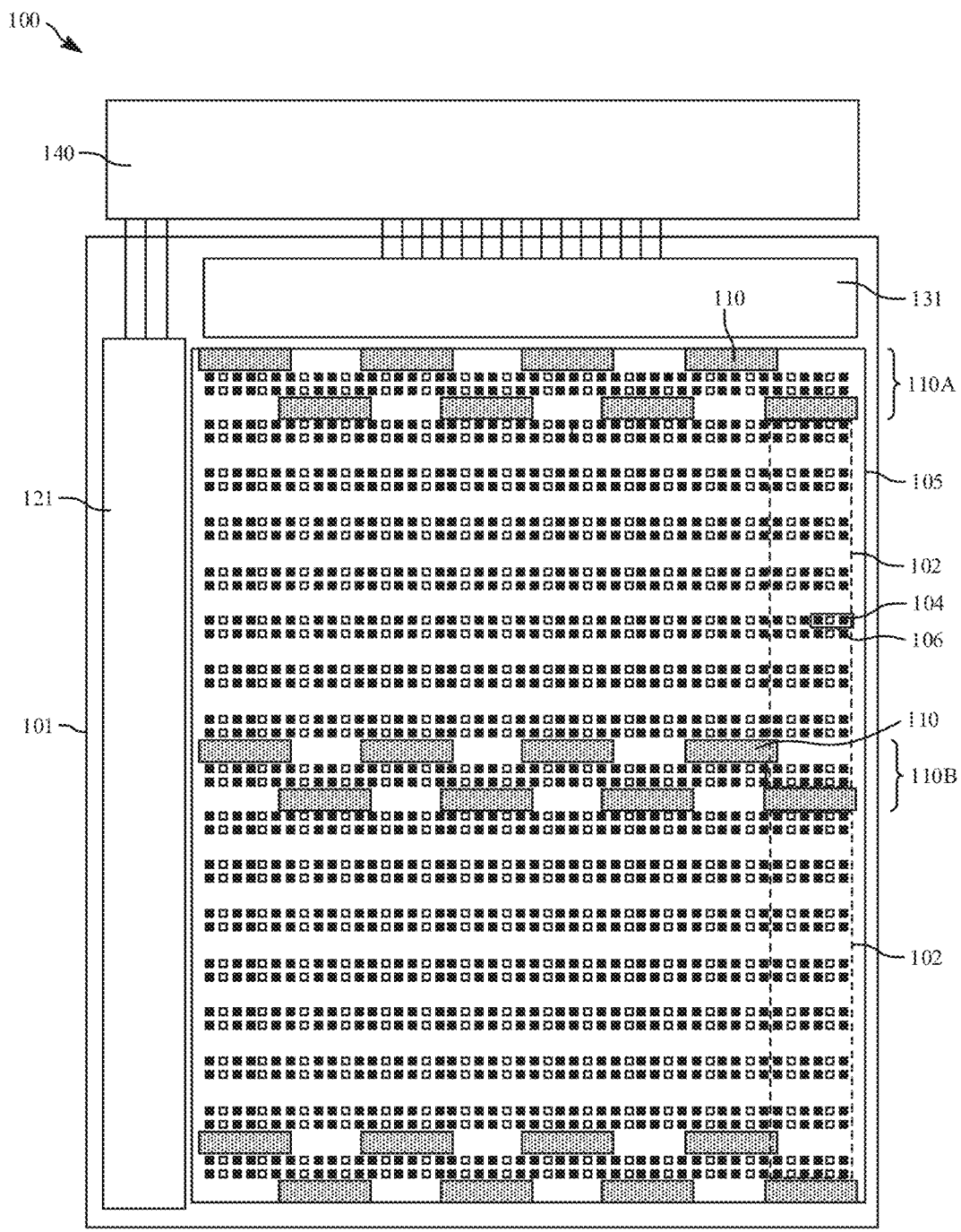
FIG. 1 is schematic top view illustration of a local passive matrix display including rows of primary pixel driver chips and redundant pixel driver chips in accordance with an embodiment.

Embodiments describe local passive matrix displays and methods of operation. For addressing of LEDs in displays the use of small silicon pixel driver chips is proposed. The pixel driver chips can supply higher currents that may be needed for efficient driving of micro LEDs (μLEDs), for example, which may be inorganic semiconductor-based LEDs with a maximum width dimension of less than 100 μm such as less than 20 μm, 10 μm or less than 5 μm. The small silicon pixel driver chips may have higher stability of transistors compared to a thin film transistor (TFT) backplane, and the ability to have pulse width modulation (PMW) incorporated into the pixel driver chips. This can allow driving of the μLEDs at optimum efficiency points using PWM to generate grey levels.

A so-called direct-drive mode may the most straightforward implementation of pixel driver chips in which there are two connections to a pixel driver chip per LED, where one current source in the pixel driver chip controls one LED. In accordance with embodiments, a local passive matrix (LPM) configuration is implemented in which a current source is shared by a number of LEDs in a time multiplexed way. The LPM approach may use less silicon area and cost savings compared to a direct-drive approach. Additionally, the total time each LED is emitting light may be reduced in LPM compared to a direct-drive mode, as all LEDs in one column share a total available addressing time. For example, referring briefly to FIG. 3, in an example in which each LPM tile contains 6 columns and 8 rows, each LED may only be active ⅛th of the total available addressing time.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known techniques and components have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

In one aspect, embodiments describe local passive matrix (LPM) displays in which pixel driver chips are distributed about the display area to drive matrices of pixels. Compared to direct drive approach, where every pin of the pixel driver is connected to one LED, the LPM arrangements in accordance with embodiments may significantly reduce 1) the silicon area associated with the pixel drivers, and 2) the panel peak panel current. In some embodiments the pixel driver chips are distributed between LEDs. Such a configuration may include pixel driver chips being laterally between LEDs on the same side of the display substrate. Depending upon complexity, the pixel driver chips may be longer than the corresponding LED matrices they control (e.g. wider than row length of a corresponding matrix). As a result, the pixel driver chips may be staggered, for example, in zigzag patterned rows. It is not required that the pixel driver chips be mounted on the same surface as the LEDs, or between the LEDs. In accordance with all embodiments described herein the pixel driver chips may also be located within the display substrate, and may be positioned face up (e.g. with terminals facing up towards the LEDs), positioned face down (e.g. with terminals facing away from the LEDs), or both (with terminals on both top and bottom sides). Thus, where the pixel driver chips are described herein as being distributed about a display area, or interspersed with a display area, it is understood the pixel driver chips may be on the display substrate (e.g. surface mounted) or embedded within the display substrate. In accordance with all embodiments described herein the pixel driver chips may be adjacent a corresponding plurality of pixels. Likewise, this includes configurations of both pixel drivers chips on or within the display substrate, where the pixel driver chips are adjacent to LEDs on the display substrate. As used herein, and throughout the figures, the term pixel driver chip may be used interchangeably with the term micro driver (also abbreviated as µDriver, µDry, µDr, µD), which is characteristic of the LED driving function and size scale, which may optionally be on the order of the pixel sizes. The LPM displays in accordance with embodiments may be implemented in both large area displays, as well as high resolution displays with high pixel density.

The pixel driver chips in accordance with embodiments may additionally include distinct driver portions, or slices, for driving matrices on top and bottom of the pixel driver chips. For example, the pixel driver chips and first/seconds portions, or slices 0/1, may be separated into primary/redundant configurations, or master/slave configurations. In some embodiments, a master portion, or slice 0, of each pixel driver chip is default active for each pixel driver chip, and the slave portion, or slice 1, of each pixel driver chip is default inactive. Thus, a slave or redundant portion only becomes active if a master or primary portion from an adjacent pixel driver chip is defective, or inactive. In some embodiments, both portions or slices 0, 1 of a primary pixel driver chip are default active, while the corresponding portions or slices 0, 1 of a redundant pixel driver chip are default inactive. Thus, a portion, or whole, of a redundant pixel driver chip only becomes active if an adjacent primary pixel driver chip portion is defective, or inactive. In accordance with embodiments, the arrangements of LED matrices, pixel driver chips, and redundancy configurations, may result in particular LED emission progressions in operation of the display panel.

In another aspect, embodiments describe display structures that may reduce border area, and be compatible with curved display edges. For example, conventional display panels include a border area outside of the display area (e.g. area including LEDs) that is reserved for driver ledges, control circuit connection, etc. In some embodiments, each row of pixel driver chips may include a corresponding row driver chip. In this manner, the individual row drivers may be located at a border area just outside of a curved display area. This may save space compared to a straight driver ledge, and increase efficiency. In some embodiments, row drivers are distributed among the rows of display drivers in the display area. Thus, the area commonly reserved for driver ledges may be omitted.

In another aspect, embodiments describe tiled display structures that may add flexibility in design of display shape, and facilitate the ability to locate cutouts in the display area. In some embodiments, the tiled display structure is facilitated by an arrangement of distributed row drivers in the display area.

FIG. 1 is schematic top view illustration of a local passive matrix display 100 including rows of pixel driver chips 110 in accordance with an embodiment. Each pixel driver chip 110 may include two portions or slices 0, 1 for operation of pixel matrices 102 above and under the pixel driver chip 110. Each matrix 102 may include a plurality of LEDs 104 and a plurality of pixels 106. In some configurations, the rows of pixel driver chips 110 are arranged in rows of primary pixel driver chips 110A and redundant pixel driver chips 110B.

Generally, the local passive matrix display 100 may include a display substrate 101, a display area 105, an arrangement of row drivers 121, or scan line driving circuits, and column drivers 131, or signal line driving circuits. An external control circuit 140 is attached with the display substrate 101 to supply various control signals, video signals, and power supply voltage to the display substrate 101.

It is to be appreciated that the number and size of the pixel driver chips 110 within the display area 105 is not necessarily drawn to scale, and is enlarged for illustrational purposes. Furthermore, illustration of row drivers 121 and column drivers 131 has also been generalized. These areas may be removed in some embodiments, or replaced with a plurality of chips.

Figure 2:
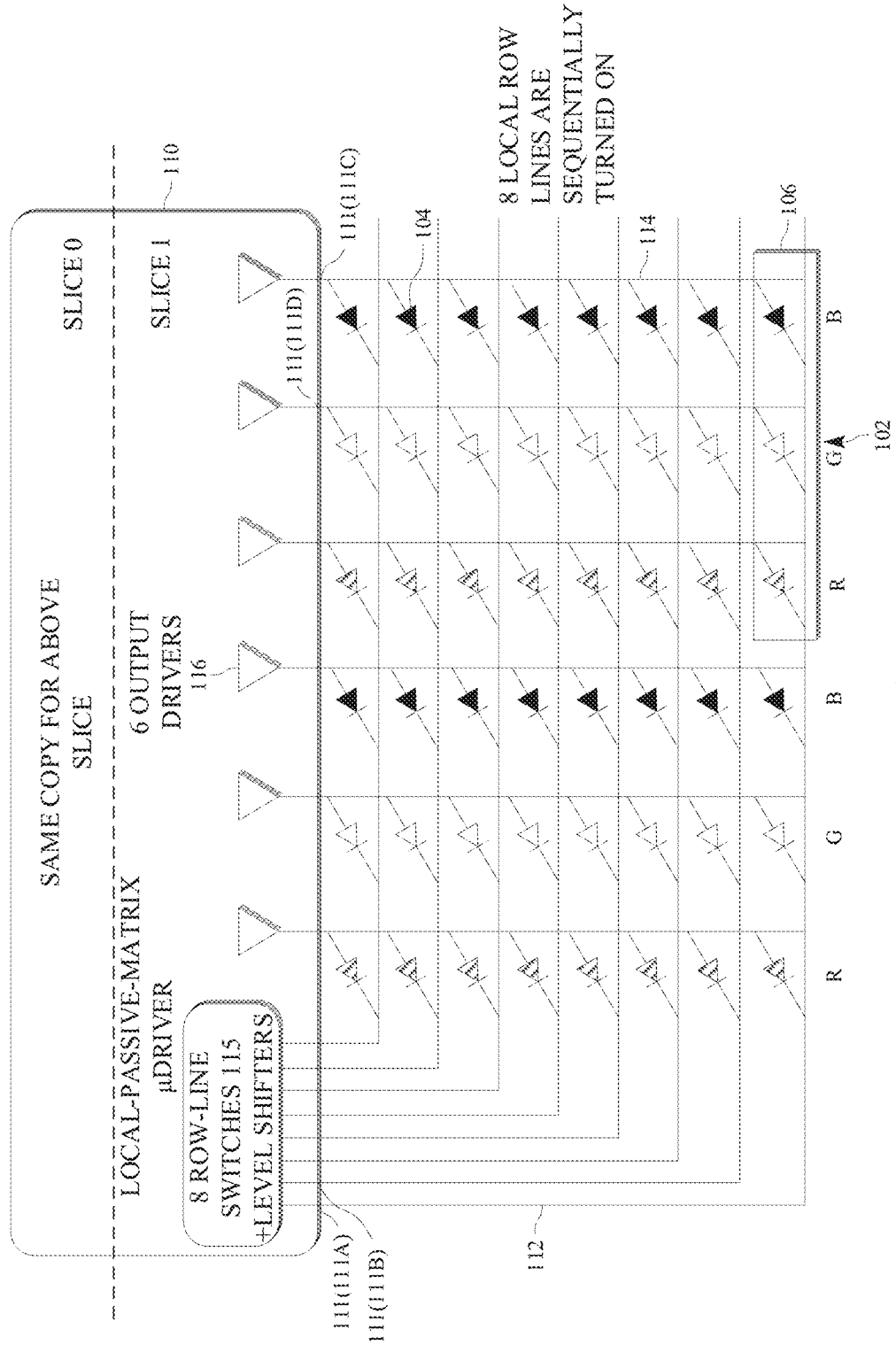
FIG. 2 is a schematic diagram of a matrix of light emitting diodes (LEDs) coupled with terminals of a pixel driver chip in accordance with an embodiment.

Referring now to FIG. 2, a schematic diagram of a matrix 102 of light emitting diodes (LEDs) coupled with terminals of a pixel driver chip is provided in accordance with an embodiment. In an embodiment, a local passive matrix display includes a pixel driver chip 110, a plurality of pixels 106 arranged in a plurality of display rows, and a plurality of terminals 111 of the pixel driver chip 110 coupled with the LEDs 104 of the plurality of pixels 106. As shown in FIG. 2, a portion of the terminals 111 are coupled with corresponding row-line switches and level shifters within the pixel driver chip 110 and corresponding rows of LEDs 104, and a portion of the terminals 111 are coupled with output drivers 116 of the pixel driver chip 110 and corresponding columns of LEDs 104. For example, interconnects 112 may connect to electrodes (e.g. cathodes) of a row of LEDs 104 to corresponding row-line switches and level shifters, while interconnects 114 may connect electrodes (e.g. anodes) of a column of LEDs 104 to corresponding output drivers 116, or vice-versa. The particular embodiment illustrated in FIG. 2 illustrates as matrix 102 of LEDs 104 connected to a portion of the pixel driver chip 110, and more specifically to "Slice 1" of the pixel driver chip 110. Similar connections may also be provided for the second portion, or "Slice 0", of the pixel driver chip 110. It is to be appreciated, that usage of the term "slice" is simplified, and in no way suggests a geometric split of circuitry within the pixel driver chips 110, and instead is a simplistic reference to top and bottom connections in the illustration. Additionally, the particular selection of eight rows and six columns of LEDs within a matrix is exemplary, and embodiments are not so limited.

In an embodiment, a first terminal 111A of the pixel driver chip 110 is coupled with a first row of light emitting diodes (LEDs) 104 of the plurality of pixels, a second terminal 111B of the pixel driver chip 110 is coupled with a second row of LEDs of the plurality of pixels, and a third terminal 111C is coupled with a first column of LEDs of the plurality of pixels, the first column of LEDs including a first LED of the first row of LEDs and a first LED of the second row of LEDs. A fourth terminal 111D is coupled with a second column of LEDs of the plurality of pixels, the second column of LEDs including a second LED of the first row of LEDs and a second LED of the second row of LEDs. As shown, the third terminal may be coupled with a first output driver 116 of the pixel driver chip, and the fourth terminal coupled with a second output driver 116 of the pixel driver chip. As shown in FIG. 1, the pixel driver chip 110 may be in a row of pixel driver chips in a line across the display substrate. In other embodiments, the row of pixel driver chips may be curved along the display area of the display substrate.

In the embodiment illustrated, the rows of LEDs 104 correspond to different emission colors of LEDs, such as red (R), green (G), blue (B) in an RGB pixel arrangement. Alternative pixel arrangement may also be used.

Figure 3:
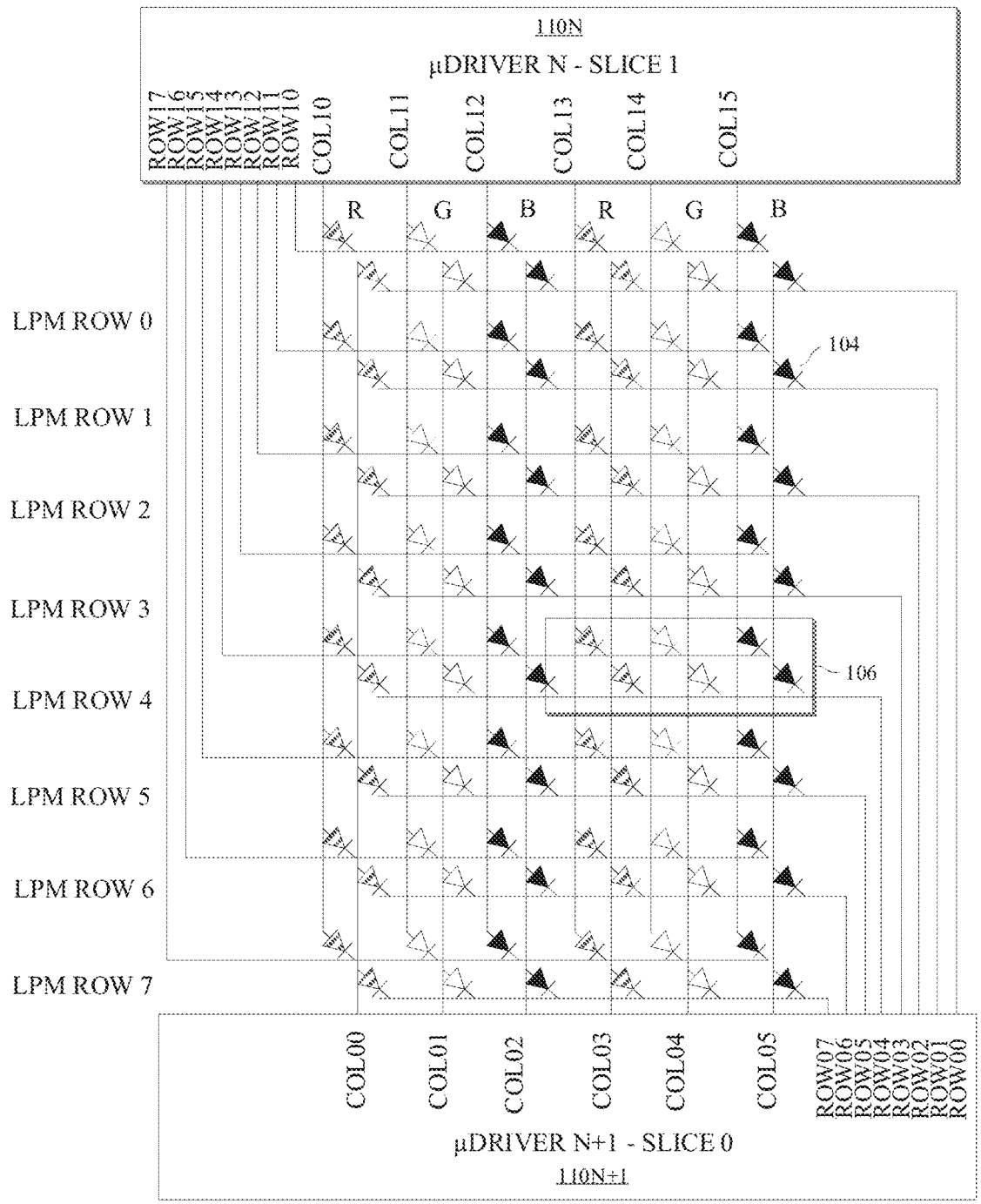
FIG. 3 is a schematic diagram of a matrix of redundant pairs of LEDs being driven by redundant pairs of pixel driver chips in accordance with an embodiment.

FIG. 3 is a schematic diagram of a matrix of redundant pairs of LEDs being driven by redundant pairs of pixel driver chips in accordance with an embodiment. FIG. 3 illustrates a matrix 102 similar to that illustrated in FIG. 2, with the addition of redundant LEDs 104 within the pixels 106. In such an embodiment, a portion (slice 1) of pixel driver chip 110 N includes terminals 111 coupled with the LEDs 104, similar as described with regard to FIG. 2. In addition, within the same matrix 102, a portion (slice 0) of pixel driver chip 110 N+1, e.g. in the next row of pixel driver chips, is also similarly coupled with redundant LEDs 104, with separate interconnects 112, 114. In this manner, providing separate anode and separate cathode contacts for pixel driver chip N and pixel driver chip N+1 can prevent timing conflict between the primary and pixel driver portions (e.g. slice 0, slice 1) associated with the same matrix 102.

In an embodiment, such as that illustrated in FIG. 3, separate cathodes can be provided for primary and redundant portions, or slices, of the pixel driver chips 110. In one method of operation, half of the pixel driver chips 110 (e.g. primary pixel driver chips 110A) are active by default. Thus, every other row of pixel driver chips 110 is active. The LEDs 104 coupling with the pixel driver chips 110 may also be staggered, for example, to mitigate visual artifacts.

Figure 4:
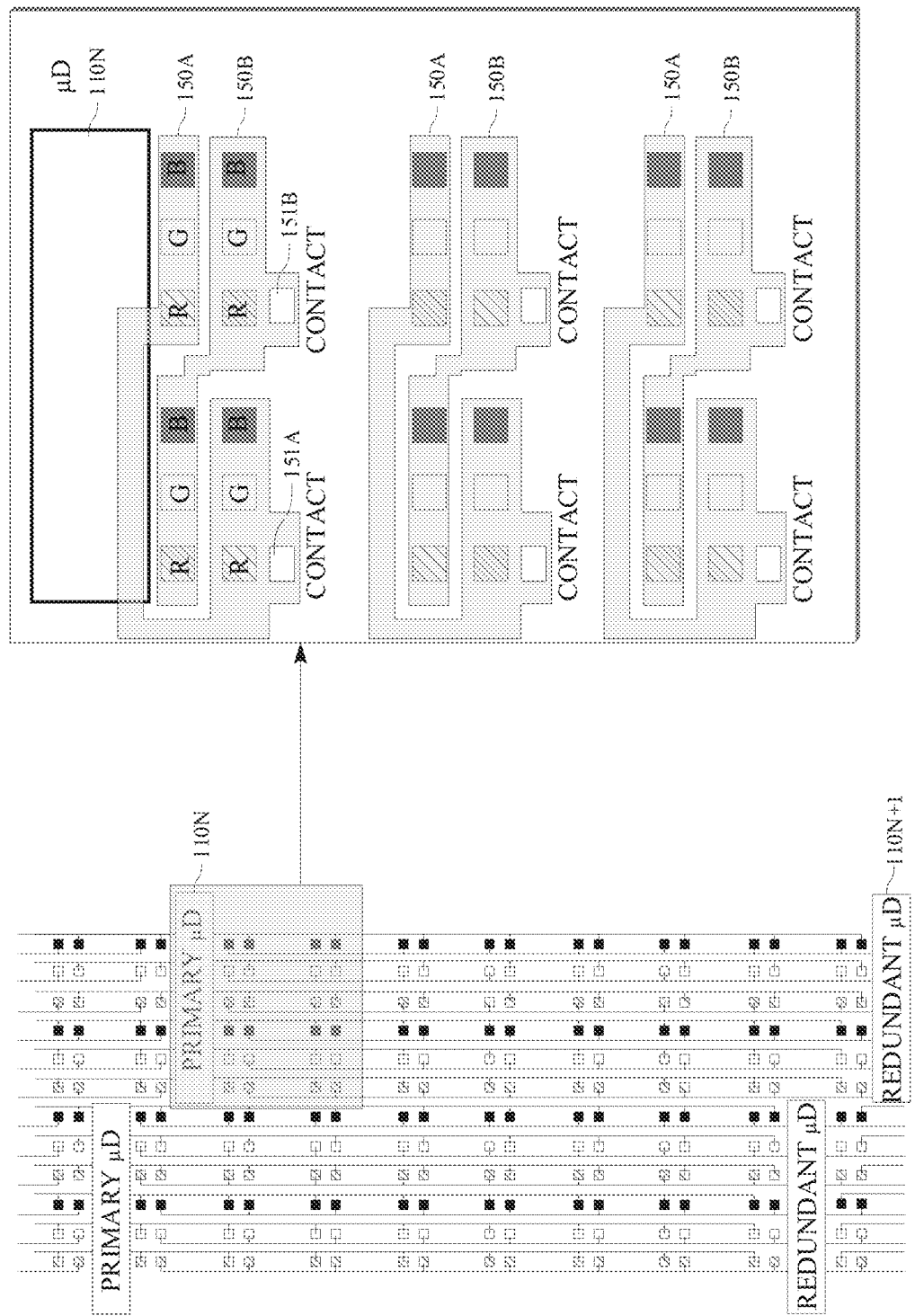
FIG. 4A is a schematic top view illustration of primary and redundant LED anode connections being driven by a pair of primary and redundant pixel driver chips in accordance with an embodiment.
FIG. 4B is a schematic top view illustration of cathode connections to the primary and redundant LEDs of FIG. 4A in accordance with an embodiment.

FIG. 4A is a schematic top view illustration of primary and redundant LED anode connections being driven by a pair of pixel driver chips in accordance with an embodiment. FIG. 4B is a schematic top view illustration of cathode connections to the primary and redundant LEDs of FIG. 4A enabling decoupled emission timing for the primary and redundant LEDs for a given pixel. As shown, each row of LEDs 104 within the matrix 102 is staggered. This can be done at the LED 104 level, or alternatively, as illustrated at the pixel 106 level. As shown, each row of LEDs includes a primary row, and redundant row, which may be staggered. A top contact layer 150A, such as a transparent conductive oxide, can be formed over the LEDs within a first row, and a first terminal (e.g. 111A) of the pixel driver chip 110 (N, slice 1). The top contact layer 150A, may contact a pad 151A, that is in electrical connection with the first terminal (e.g. 111A) by interconnect 112. Similarly, a top contact layer 150B can be formed over the LEDs within the first row, and a first terminal of the pixel driver chip 110 (N+1, slice 0). Top contact layer 150B, may contact a contact pad 151B, that is in electrical connection with the corresponding first terminal of pixel driver chip 110 (N+1, slice 0).

The local passive matrix displays 100 in accordance with embodiments may include one or more row driver chips for each row of pixel driver chips 110. In some embodiments, each row of pixel driver chips includes a primary row driver chip and a redundant row driver chip. Thus, the redundancy that is built into the arrangement of LEDs and pixel driver chips may be extended to the row driver chips. The row driver chips in accordance with embodiments may buffer or generate the data update and emission control signals for the pixel driver chips. The row driver chips may be configured by the external control circuit 140 using dedicated configuration clock and data signals.

Figure 5:
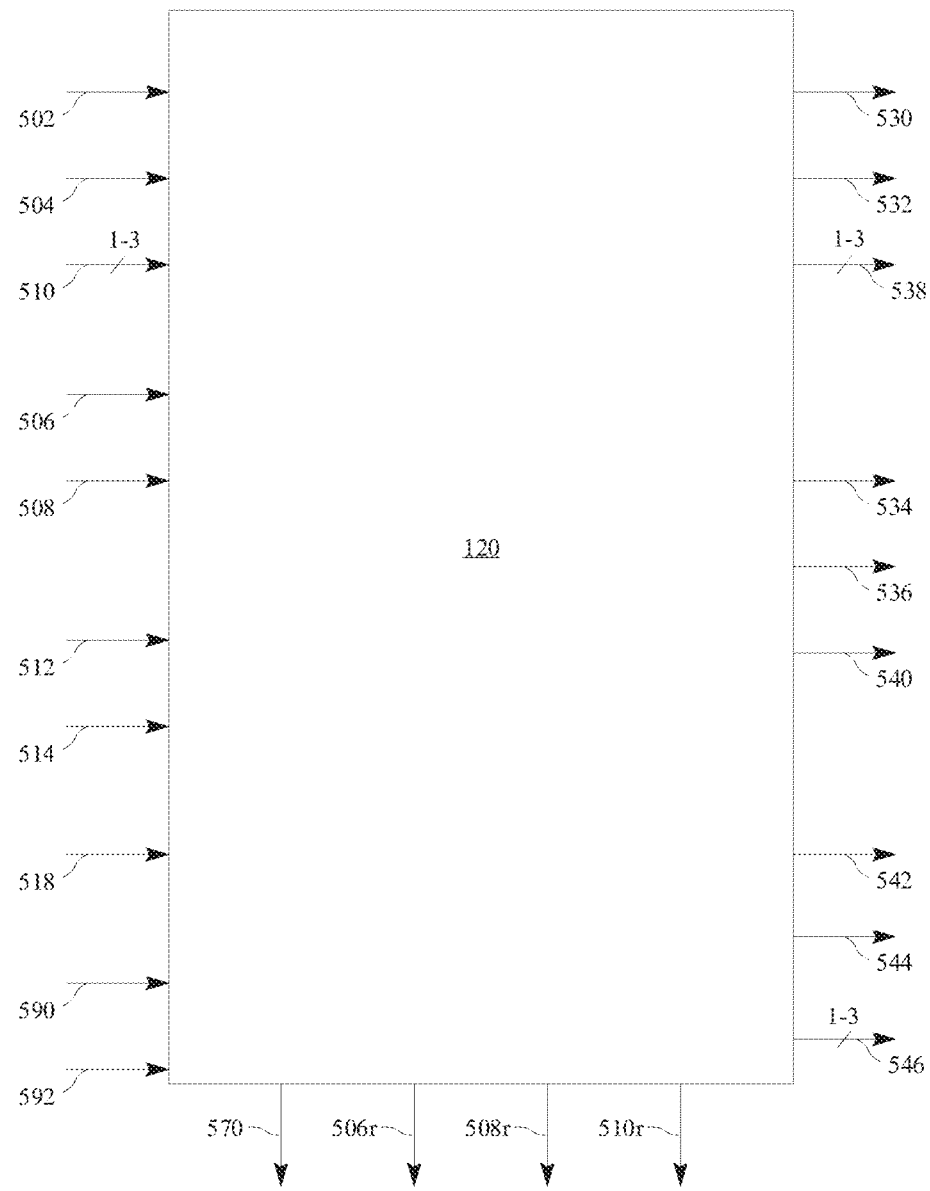
FIG. 5 is a schematic illustration of input/output terminals for a row driver chip in accordance with an embodiment.

FIG. 5 is a schematic illustration of input/output terminals for a row driver chip in accordance with an embodiment. The particular illustration of terminals in FIG. 5 is intended to provide an understanding of some input/output terminals and signals, as not intended to be all-inclusive, or limiting. As shown, signal lines 502-518, 590, and 592 are input into each row driver chip 120, for example, from the external control circuit 140. The input signals to row drivers are the vertical backbone signals or "base" signals including at least the "base data clock" 502, "emission base clock" 510, and "base configuration update" 504 signal. Additional inputs to the row driver chips 120 are the vertical selection token (VST) signals, including VST0 512 and VST1 514, and VST scan clock 518. VST 0/1 signals determine which row driver chip 120 receives the active token. Here the distinction of 0/1 is related to primary and redundant row driver chips 120, as opposed to slices. As described in more detail with regard to FIGS. 8E-8H, a particular row driver chip 120 uses the VST signals (512, 514, 518) as the token along with the base data clock 502 signals to generate data clocks 530, 542 and configuration clocks 532, 544 for the pixel driver chips 110 of the same row. A vertical synchronization token-out (VST out) 540 is output to the pixel driver chips 110. A "repeat" VST signal 570 is output from the row driver chip 120 to an adjacent row driver chip 110 in the same row, or row below.

Additional inputs to the row driver chips 120 are row driver configuration clock 590, and row driver configuration data 592. These signals are specific to the row driver chips 120, and are not shared with the pixel driver chips 110. Pixel driver chips 110 at a particular row receive the data clocks 530, 542 and configuration clocks 532, 544 from the corresponding row driver chips 120. Additional inputs include a base emission row synchronization 506 signal for ordering row emission, and a base emission frame synchronization 508 signal for ordering frame/subframe emission sequence. The output signals from the row driver chips 120 to the pixel driver chips 110 are the horizontal row control signals that are derived from the base signals gated by a token bit or VST bit at a particular row. These include emission clocks 538, 546 for red, green, and blue LEDs along with data clocks 530, 542 and configuration (update) clocks 532, 544. The emission clock for red, green and blue LEDs can be separate or shared depending on the LED characteristics and the I/O pin limitations on the pixel drivers. Additional outputs from the row driver chips 120 to the pixel driver chips 110 include emission row synchronization 534 and emission frame synchronization 536 signals for the LPM matrices.

One or more emission base clocks 510 are input into the row driver chip 120. For example, each LED color (e.g. red, blue, green) may include a separate emission base clock 510, or groups of LEDs (e.g. blue, green) may share a common emission base clock. The row driver chip 120 outputs separate emission clock_0 538 lines for pixel driver chip slices 0, and emission clock_1 546 lines for pixel driver chip slices 1.

Figure 8A:
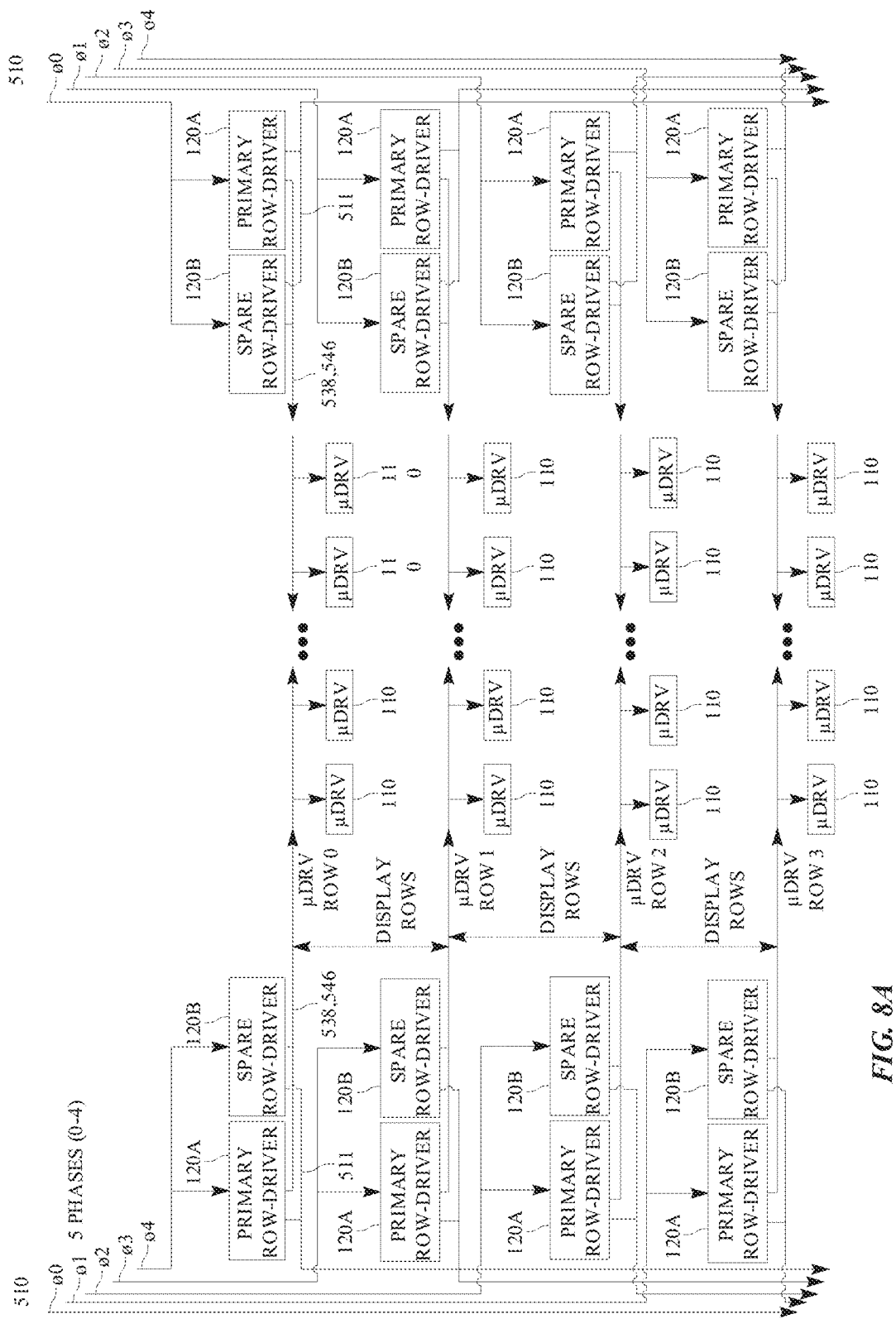
FIG. 8A is a panel connection diagram of emission clock signal lines to an array of pixel driver chips for a local passive matrix display in accordance with an embodiment.

As described in further detail with regard to FIG. 8A, different groups (rows) of row driver chips 120 may operate with different clock phases, with each clock phase being selectively, and separately, wired to the respective row driver chips 120. For example, a base emission clock 510 of specific phase (e.g. 0-4) is input into a specific group of row driver chips 120, which output emission clocks 0/1 538, 546 to the pixel driver chips 110. Each row driver chip 120 additionally has another output to transmit buffered emission base clock "repeat" 510r signals to other row driver chips 120 in the same group. Additionally, each row driver chip 120 may include emission row synchronization "repeat" 506r, and emission frame synchronization "repeat" 508r outputs for transfer of buffered repeat signals to other row driver chips 120 in the same group.

Figure 6:
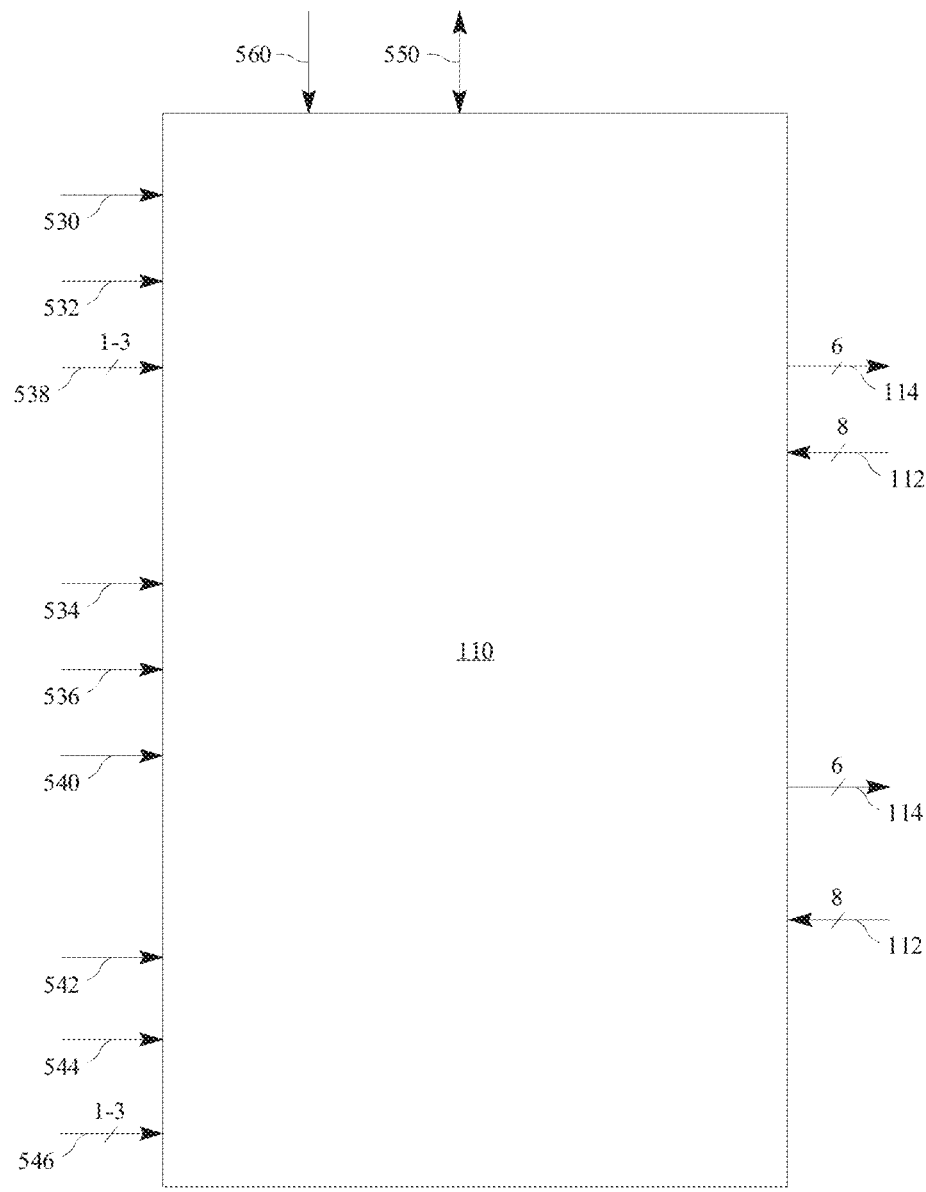
FIG. 6 is a schematic illustration of input/output terminals for a pixel driver chip in accordance with an embodiment.

FIG. 6 is a high level structure of a pixel driver chip 110 in an LPM panel from data load point of view. Data scan is based on the raster scan using the vertical data 550 signals (originating from external driver) and the horizontal data clock signal 530, 542 (originating from the row driver 120). Additionally illustrated in FIG. 6 are terminals 111 for output to the LED row interconnects 112, and LED column interconnects 114 for both portions (e.g. slices 0,1) of the pixel driver chip 110 as previously described with regard to FIGS. 2-4. A partial update 560 signal line input is optionally provided, as discussed in more detail with regard to FIG. 8B.

Figure 7:
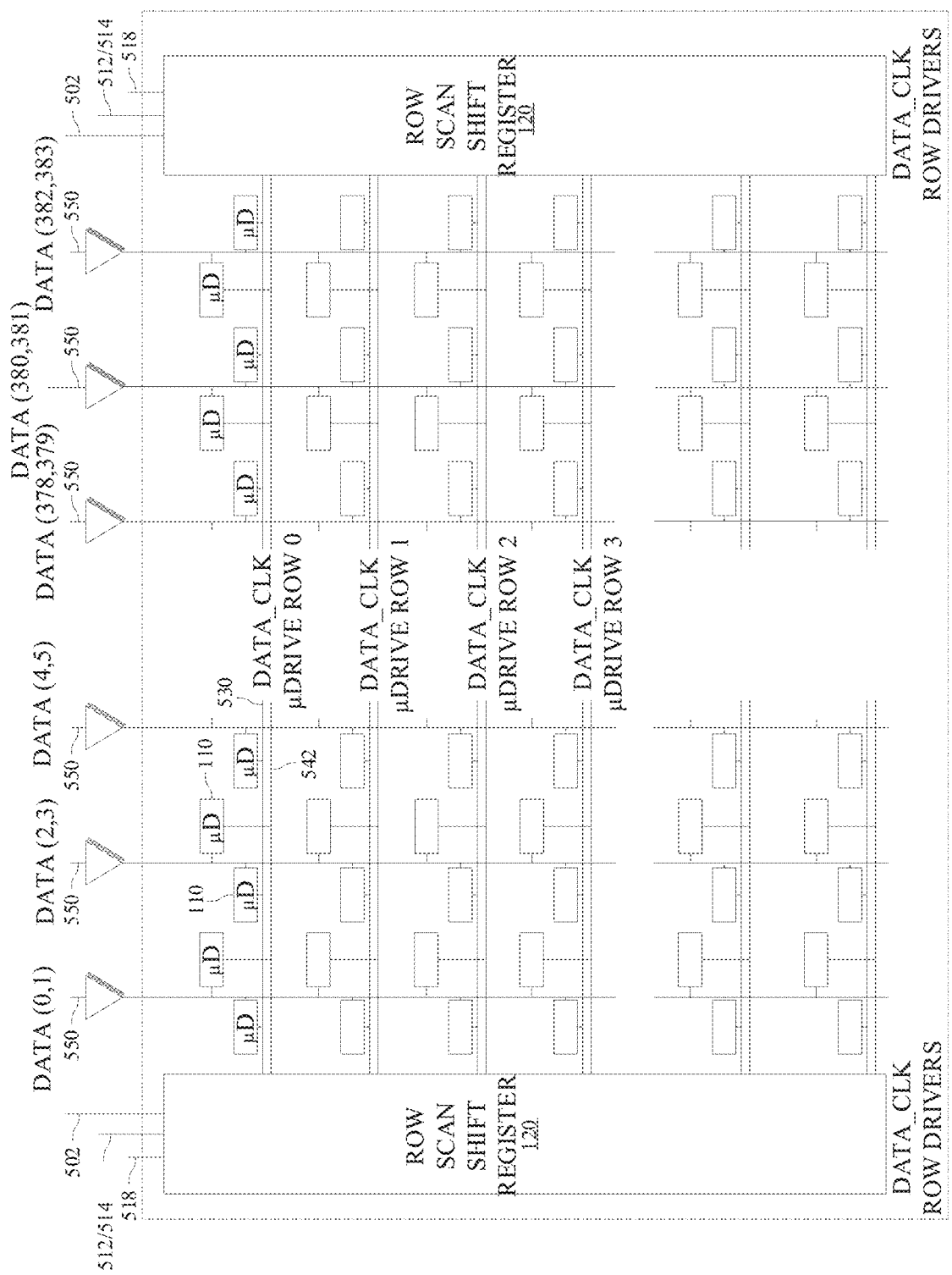
FIG. 7 is a panel connection diagram of data and data clock signal lines to an array of pixel driver chips for a local passive matrix display in accordance with an embodiment.

Referring now to FIG. 7 a panel connection diagram is provided for data 550 and data clock signal lines to an array of pixel driver chips for a local passive matrix display in accordance with an embodiment. As shown at least the base data clock 502, VST 0/1 512/514, and VST scan clock 518 signals are sent to the row driver chips 120, which taken together form a row scan shift register. Additionally, data 550 signal lines are shared between two adjacent pixel driver chips in each row of pixel driver chips. As shown in FIG. 7, data clock 0 530 and data clock 1 542 signals are transmitted to different pixel driver chips 110, also with a shared data 550 line. While columns of row driver chips 120 are provided on each side of the layout in FIG. 7, it is understood that columns of row driver chips 120 can be arranged throughout the display area, and may be connected to "backbone" routing, such as described in more detail with regard to FIG. 17.

FIG. 8A is a panel connection diagram of emission control signal lines to an array of pixel driver chips for a local passive matrix display in accordance with an embodiment. In particular, FIG. 8A illustrates the connection of the emission base clock (RGB) 510 signal lines to the row driver chips 120. For example, five phases (0-4) are illustrated, with each fifth row sharing a same phase. Horizontal emission clock 0,1 538, 546 signals are transmitted to the pixel driver chips 110, and buffered emission base clock "repeat" (RGB) 511 lines are transmitted to the row driver chips 120 in the same group. The vertically illustrated transmission lines 510, 511 may be part of the "backbone."

Figure 8B:
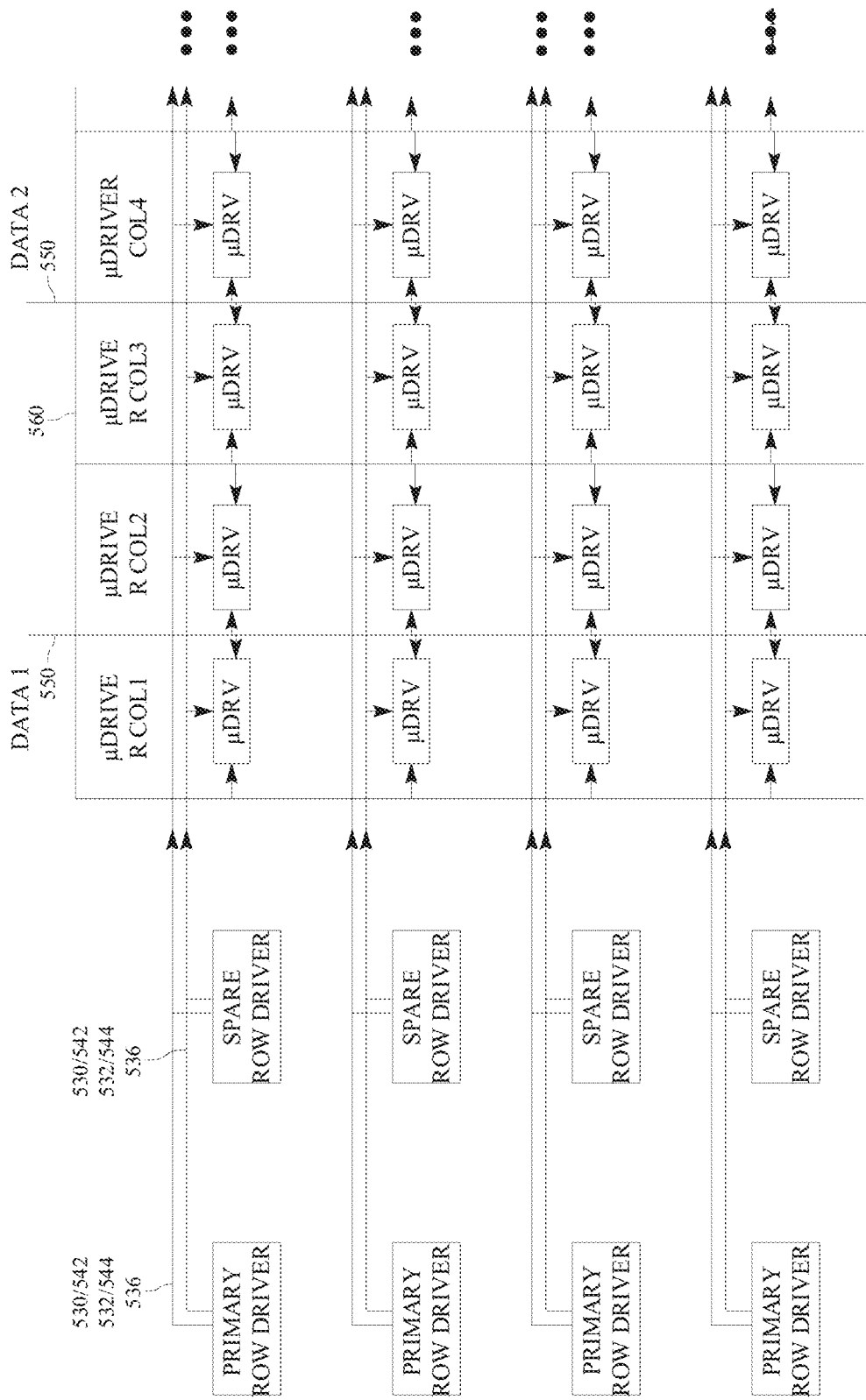
FIG. 8B is a schematic layout illustration of partial update signal lines to columns of pixel driver chips in accordance with an embodiment.
Figure 8C:
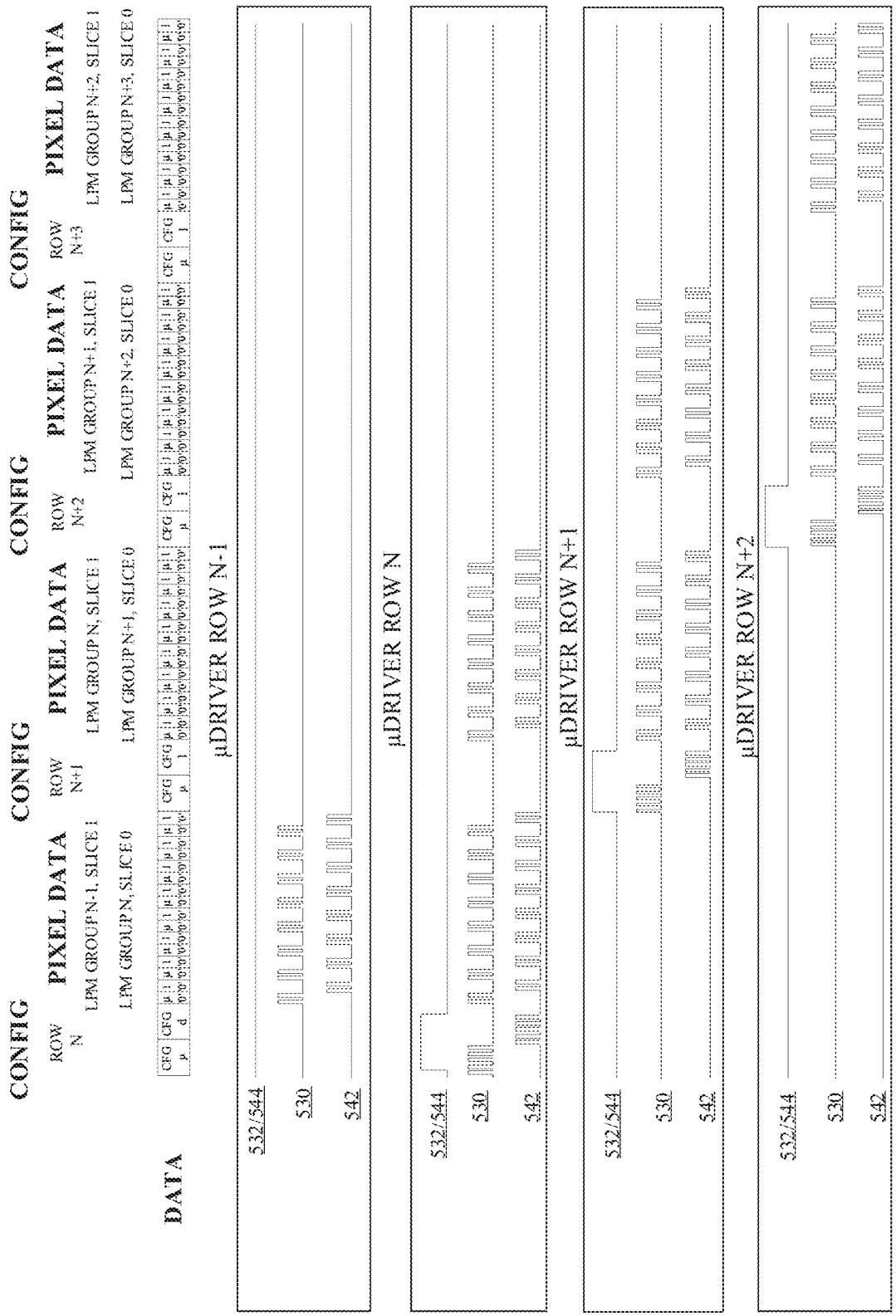
FIG. 8C is a timing diagram of a method of latching configuration bits versus pixel bits in a pixel driver chip in accordance with an embodiment.
Figure 8D:
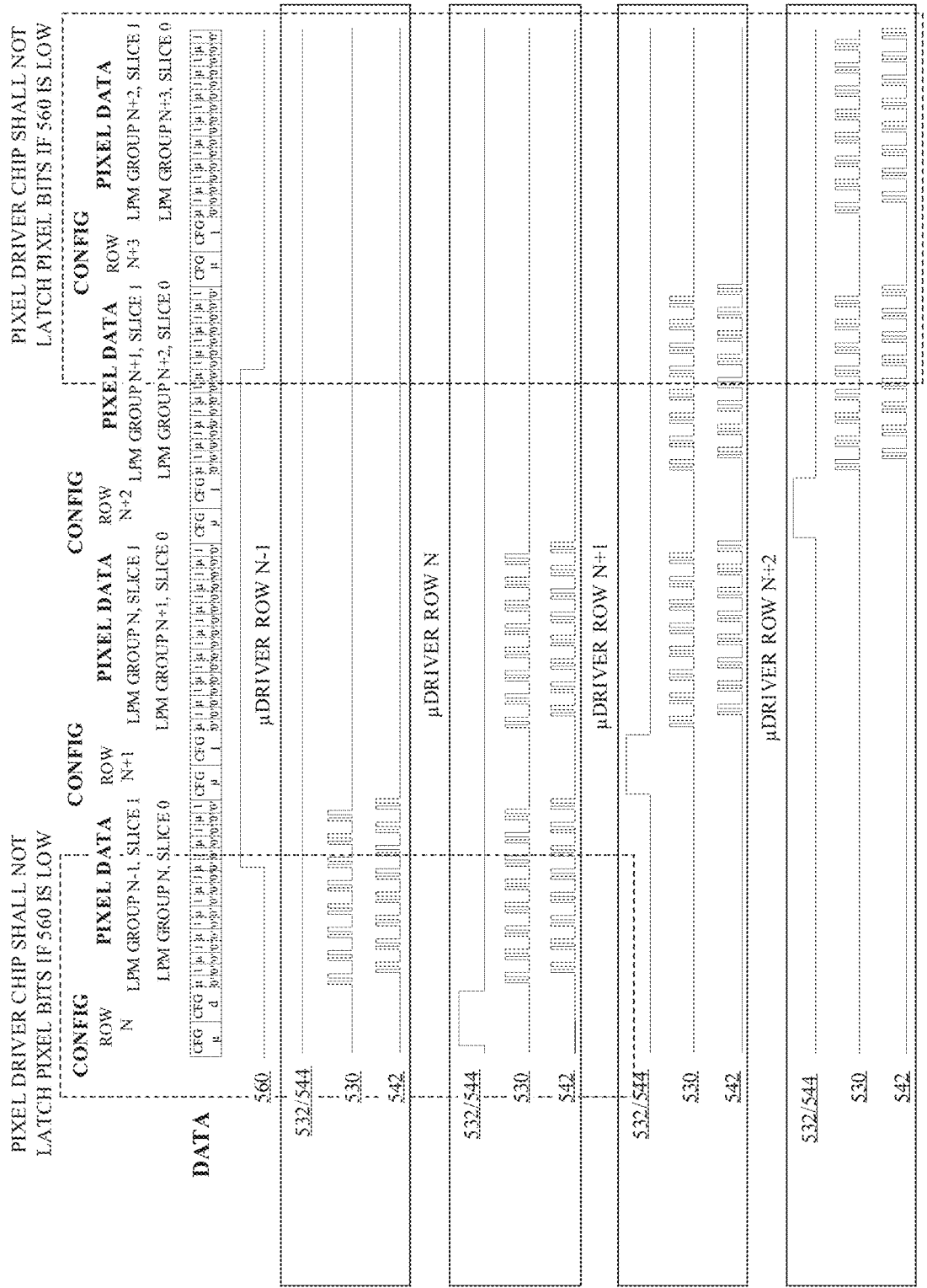
FIG. 8D is an alternative timing diagram of a method of latching configuration bits versus pixel bits in a pixel driver chip with a partial update signal line in accordance with an embodiment.

In accordance with some embodiments, a partial update 560 signal (e.g. from external control circuit 140) is sent to groups of columns of pixel driver chips 110 to control latching of configuration update and pixel bit data for the pixel driver chips 110. FIG. 8B is a schematic layout illustration of partial update 560 signal lines to columns of pixel driver chips 110 in accordance with an embodiment. In the particular embodiment illustrated, the data 550 lines are shared between two adjacent columns of pixel driver chips 110, and partial update 560 signal lines are shared amongst a group (e.g. eight columns) of pixel driver chips 110. In addition, separate signal lines for the pixel driver chip data clocks 530, 542, pixel driver chip configuration clocks 532, 544, and emission frame synchronization 536 are sent to every other pixel driver chip 110, with adjacent pixel driver chips 110 sharing a common data 550 line. FIG. 8C is a timing diagram of a method of latching configuration bits versus pixel bits in a pixel driver chip in accordance with an embodiment. As shown, configuration clock signals 532/544 are transmitted from a row driver chip 120 to a corresponding row of pixel driver chips 110 to declare whether configuration bits or pixel bits are to be updated. As shown, a pixel driver chip 110 is updated when either configuration clock 532/544 signal goes high and overlaps the data clock 530, 542 signals corresponding to an upper or lower slice 0/1. FIG. 8D is an alternative timing diagram of a method of latching configuration bits versus pixel bits in a pixel driver chip with a partial update 560 signal line in accordance with an embodiment. As shown, a partial update 560 signal can additionally be sent to groups of rows of pixel driver chips 110 to provide additional granularity to latching of configuration bits. In such an embodiment, a pixel driver chip 110 is updated when either configuration clock 532/544 signal goes high and overlaps a high partial update 560 signal.

Figure 8E:
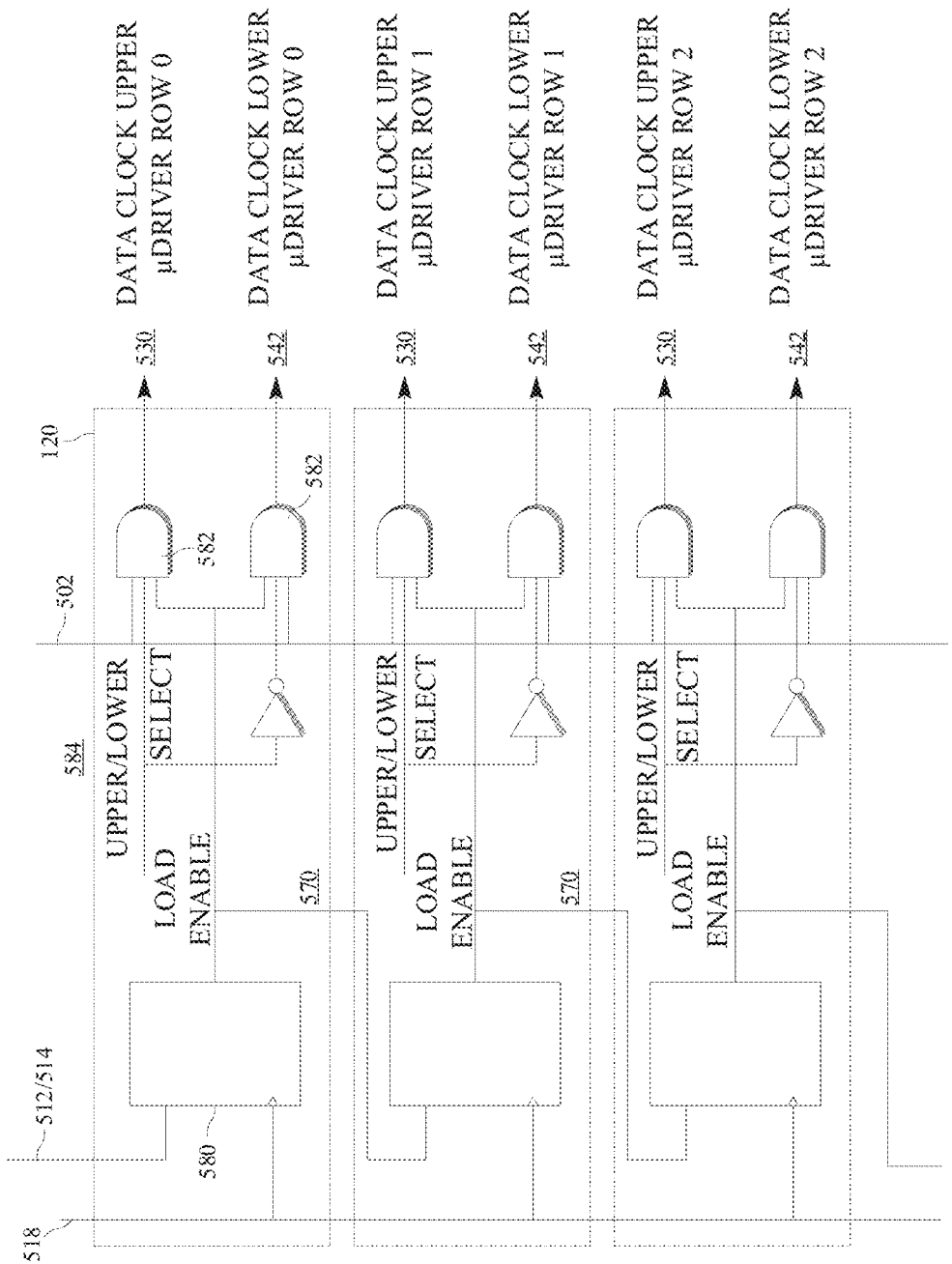
FIG. 8E is a circuit diagram for generating data clock signals in a column of row drivers in accordance with an embodiment.
Figure 8F:
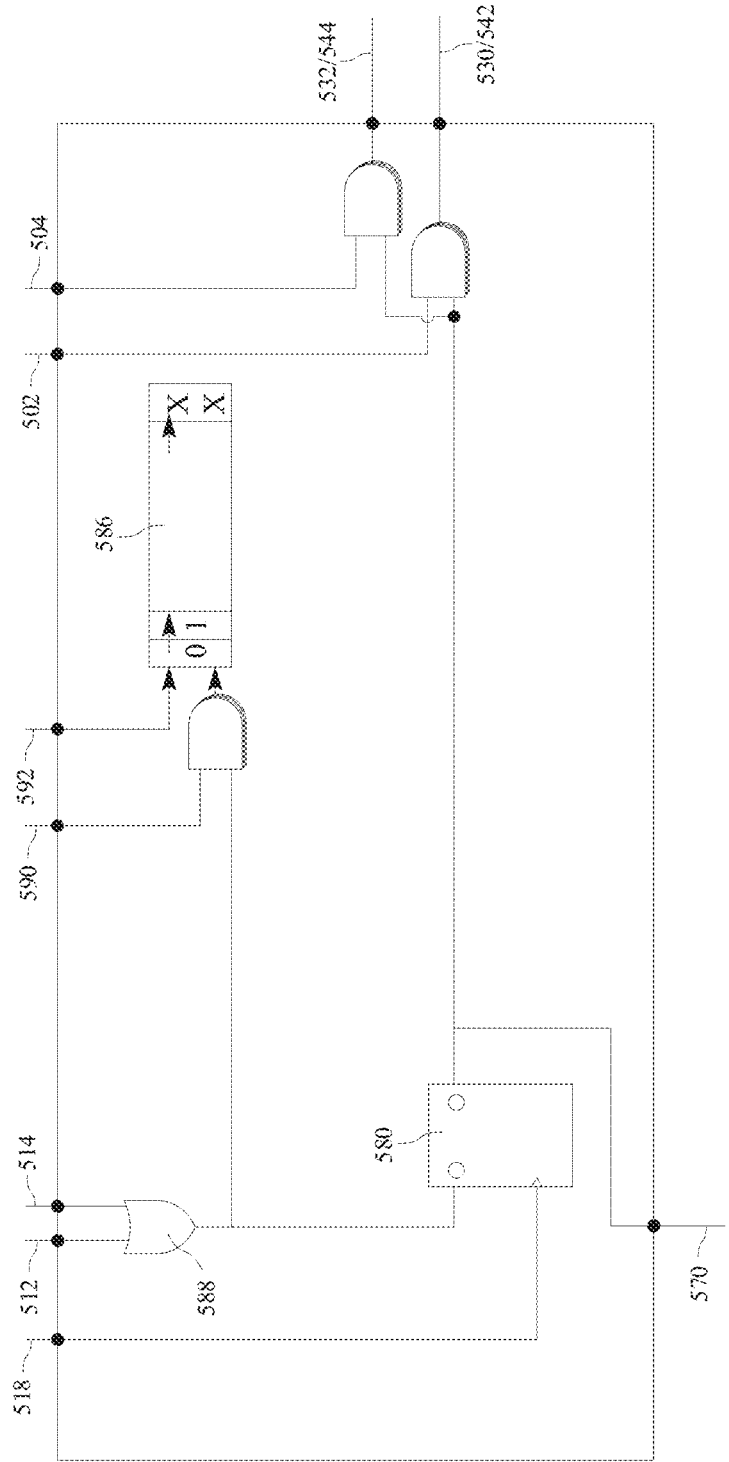
FIG. 8F is a circuit diagram of a single row driver to illustrated row driver configuration in accordance with an embodiment.

In accordance with embodiments the data clock 530, 542 signals may be generated in the row driver chips 120 and transmitted to the pixel driver chips 110. FIG. 8E is a circuit diagram for generating data clock signals in a column of row drivers in accordance with an embodiment. As illustrated the row driver chips 120 may be received the base data clock 502 signals and VST_0/1 512/514 signals and VST scan clock 518 signals. The data clocks 530, 542 may be created by the base data clock 502 signals and a gating signal created from flops 580. The gating signal and upper/lower select signals 584 are transmitted to a pair of AND gates 582, along with the base data clock 502 signal to generate the data clock 530, 542 signals. Thus, the two data clocks 530, 542 per row of pixel driver chips 110 are created by time multiplexing the base data clock 502 through the upper/lower select signal 584. As shown in FIG. 8F, a counter in the row driver chip 120 keeps track of the number of row driver configuration clock 590 and row driver configuration data 592 bits stored in memory 586 to create the upper/lower select signal 584.

FIG. 8F is a circuit diagram of a single row driver to illustrated row driver configuration in accordance with an embodiment. Similar to FIG. 8E, VST 0/1 512/514 signals are input into an OR gate 588, with an output connected to the flop 580. Output of the OR gate 588 is also connected to an input of another AND gate 594, which has an output connected to counter 582. Row driver configuration clock 590 is also connected to an input of the AND gate 594. As described with regard to FIG. 8E, data base clock 502 is input to AND gate 582, along with the output of flop 580 to generate the data clocks 530, 542. In addition, the base configuration update 504 signal for the pixel driver chips is input to AND gate 596 along with the output of the flop 580 to generate the pixel driver configuration (update) clocks 532, 544.

In an embodiment, a method of operating a local passive matrix (LPM) of a display panel includes receiving data (e.g. pixel bits from data 550 line) at a pixel driver chip 110, the pixel driver chip one of a plurality of pixel driver chips interspersed within a display area 105 of a display substrate 101, and the pixel driver chip is coupled to an LPM group 102 of LEDs 104 arranged in a plurality of display rows. In accordance with embodiments, the method includes driving the LPM group 102 of LEDs one display row at a time (for example, see FIG. 2). The data (e.g. from data clock 530, 542) update rate (number of rows per millisecond) may be independent of the emission (e.g. from emission clock 538, 546) rate (number of rows per millisecond). In accordance with embodiments, multiple display rows may be updated during emission of a single display row.

The pixel driver chip 110 may include a first driver slice (e.g. slice 0) coupled to a first LPM group 102, and a second driver slice (e.g. slice 1) coupled to a second LPM group 102 on an opposite side of the pixel driver chip from the first LPM group. In an embodiment, the first driver slice receives a first emission clock (e.g. from emission clock 538 or 544) phase (selected from phases ($\Phi 0$-$\Phi 4$)), and the second driver slice receives a second emission clock (e.g. from emission clock 538 or 544) phase (different phase selected from phases ($\Phi 0$-$\Phi 4$)) (see FIG. 9B). In such an embodiment, a data update time for each of the LPM groups 102 is bounded by a timing delay ($t_{offset}$) between the first and second emission clock phases. In an embodiment, an emission rate per display row is equal to a subframe time divided by the number of display rows per LPM group. In an alternative embodiment, the first driver slice receives a first emission clock (e.g. from emission clock 538 or 544) phase (selected from phases ($\Phi 0$-$\Phi 4$)), and the second driver slice receives the same emission clock phase (see FIG. 11C).

Figure 9A:
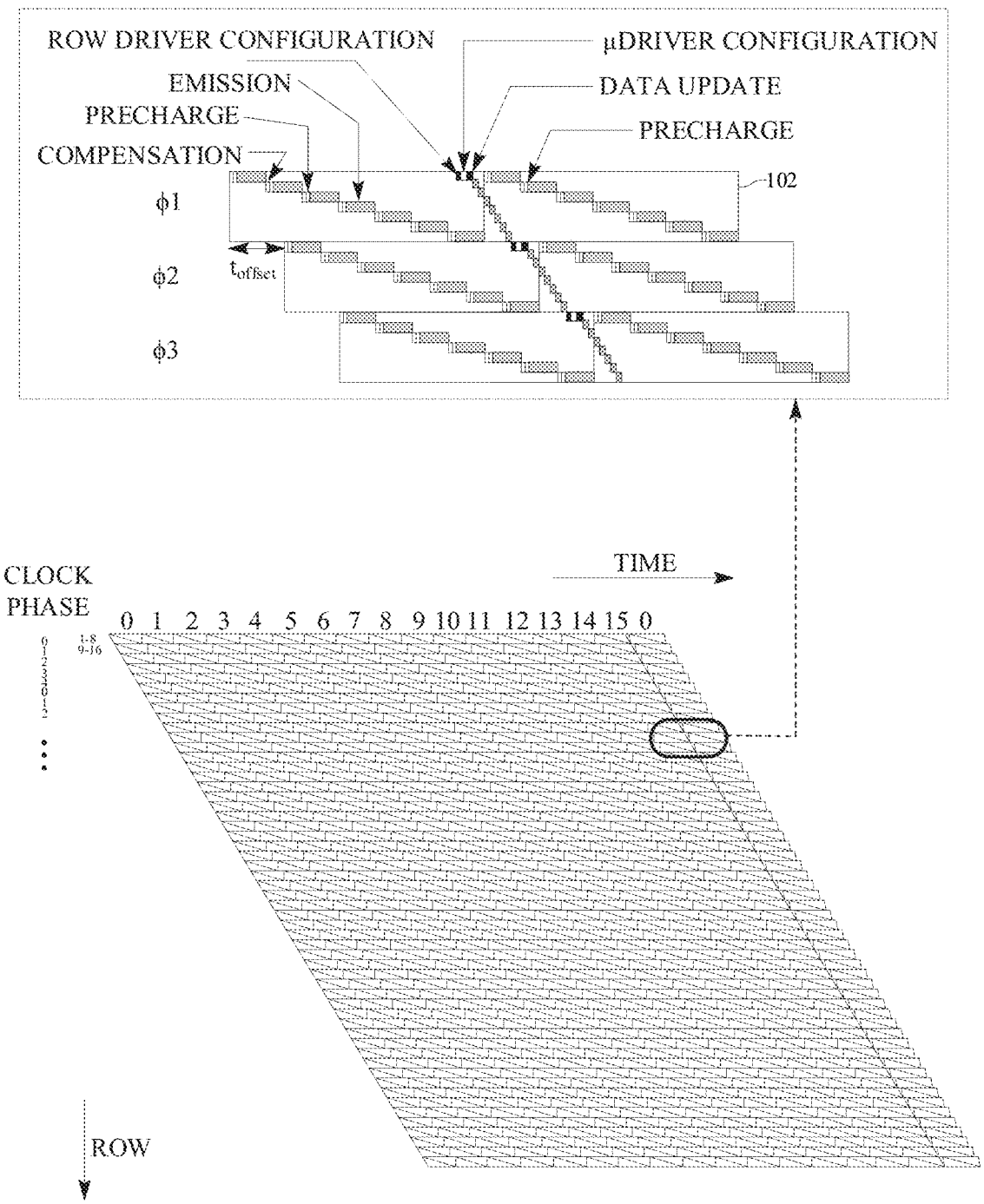
FIG. 9A is a diagram illustrating pixel driver chip data update and LED emission progression for a local passive matrix display in accordance with an embodiment.

Referring now to FIG. 9A a diagram is provided illustrating pixel driver chip data update and LED emission progression for a local passive matrix display in accordance with an embodiment. As shown, each subframe may correspond to a matrix 102 with eight rows (e.g. 1-8) and two pixel columns as previously described. Generally, panel timing illustrated in FIG. 9A may progress with 16 subframes per frame, with each subframe providing 5-bit precision (one of 5 phases, ($\Phi$0-$\Phi$4). As shown, there is an available gap for pixel update between each subframe.

As shown, timing for emission from each row within a subframe (or matrix), includes time for compensation, precharge, and emission. Each data update includes time for row driver chip 120 configuration, pixel driver chip 110 configuration, and data update of the pixel driver chip. The data update progresses row-by-row, and requires much less time than emission for all rows.

It is to be appreciated that the pixel driver chips 110 can start emission from any row in the matrices 102. For interests of clarity, it is illustrated with emission beginning with the first row. This can be programmed through the register setting. In accordance with embodiments, it can be hardwired such that slice 1 always lags behind slice 0, or vice-versa.

Figure 9B:
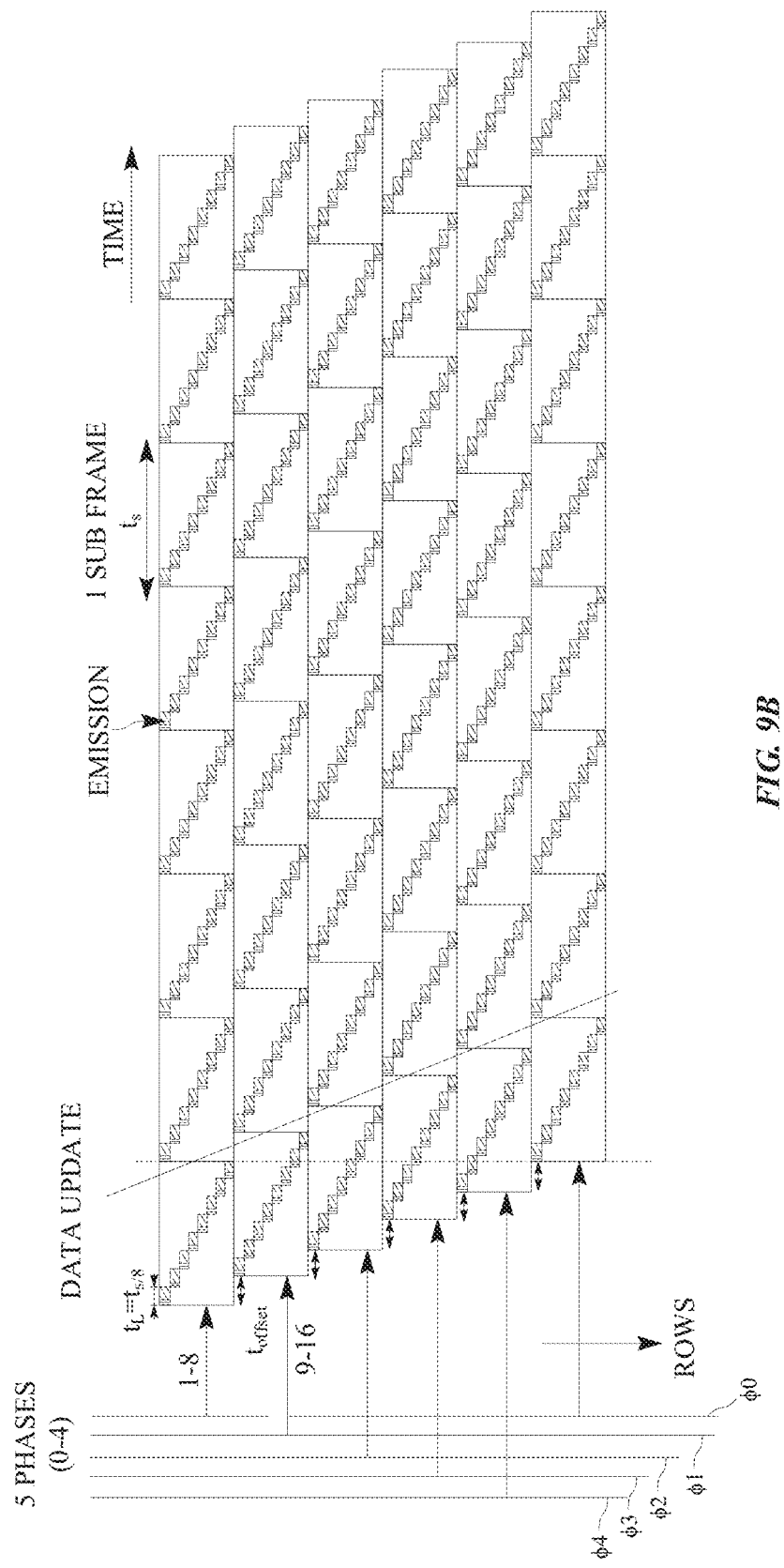
FIG. 9B is a close up illustration of the panel timing diagram of FIG. 9A illustrating a plurality of clock phases in accordance with an embodiment.

Referring now to FIG. 9B, a close up illustration is provided of the panel timing diagram of FIG. 9A to illustrate a plurality of clock phases in accordance with an embodiment. In accordance with embodiments, the emission row synchronization signals 536 and emission frame synchronization signals 536, as well as the emission clock 0, 1 signals 538, 546 may be distributed among the rows in a plurality of phases ($\Phi$0-$\Phi$4). For example, rows N and N+5 receive phase ($\Phi$0), rows N+1 and N+6 receive phase ($\Phi$0, and so forth. With a total of eight rows in each matrix 102, the panel-level emission current appears as if there are 40 (=8*5) clock phases, such that 1/40 of the panel is emitting at the same time. As shown in FIG. 9B, the time reserved for emission of one subframe is $t_s$. The time reserved for emission of one row within a subframe is $t_L=t_s/8$ (with 8 being number of rows in a matrix 102). In order to allow data update within a frame time, data update for all phases is completed in one subframe. Thus, a timing offset ($t_{offset}$) per row (N) is $t_s/5$.

Figure 9C:
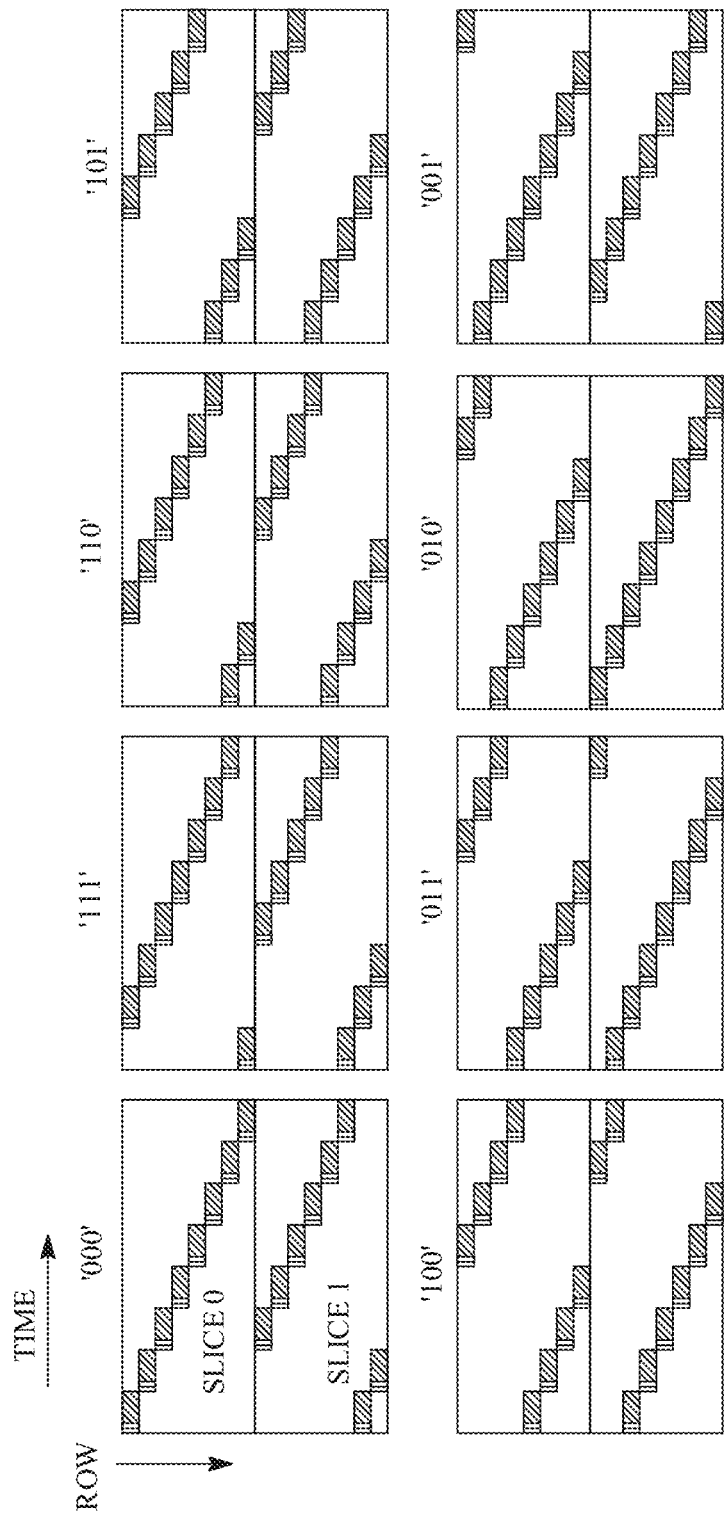
FIG. 9C is a diagram illustrating a programmable row start feature of a pixel driver chip in accordance with an embodiment.

Emission timing of the local passive matrix pixel driver chips may also be programmable. For example Slice 0, Slice 1 emission can be programmed to start from any row using configuration bits at the beginning of each subframe. For example, emission start row signals can be included in the configuration clock_0 532 and configuration clock_1 544 signals. FIG. 9C is an illustration of a row start feature of a local passive matrix pixel driver chip 110 in accordance with an embodiment. As shown, Slice 0 emission can be programmed to start from any row using an (e.g. 3 bit) emission start row configuration bit at the beginning of each substrate. For example, an emission start row of '000' states that Slice 0 of the pixel driver chip 110 starts from rows 0 at the beginning of each subframe. This feature can also provide flexibility for exploring other timing diagrams. The aspect of programmable emission timing of the local passive matrix pixel driver chips can provide flexibility to a number of emission clock phases and data/emission timing.

Figure 10A:
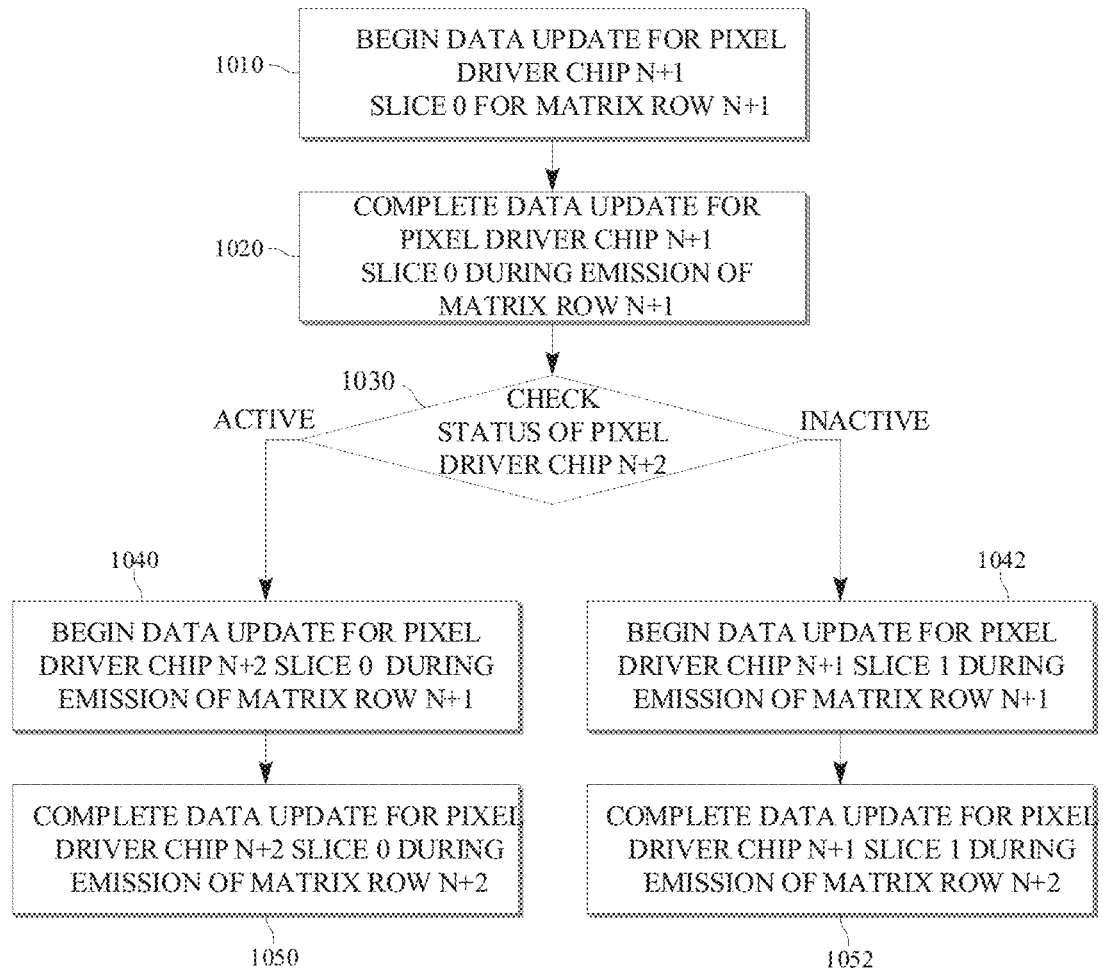
FIG. 10A is a diagram illustrating pixel driver chip data update and LED emission progression where a master portion of each pixel driver chip is active by default in accordance with an embodiment.
Figure 10B:
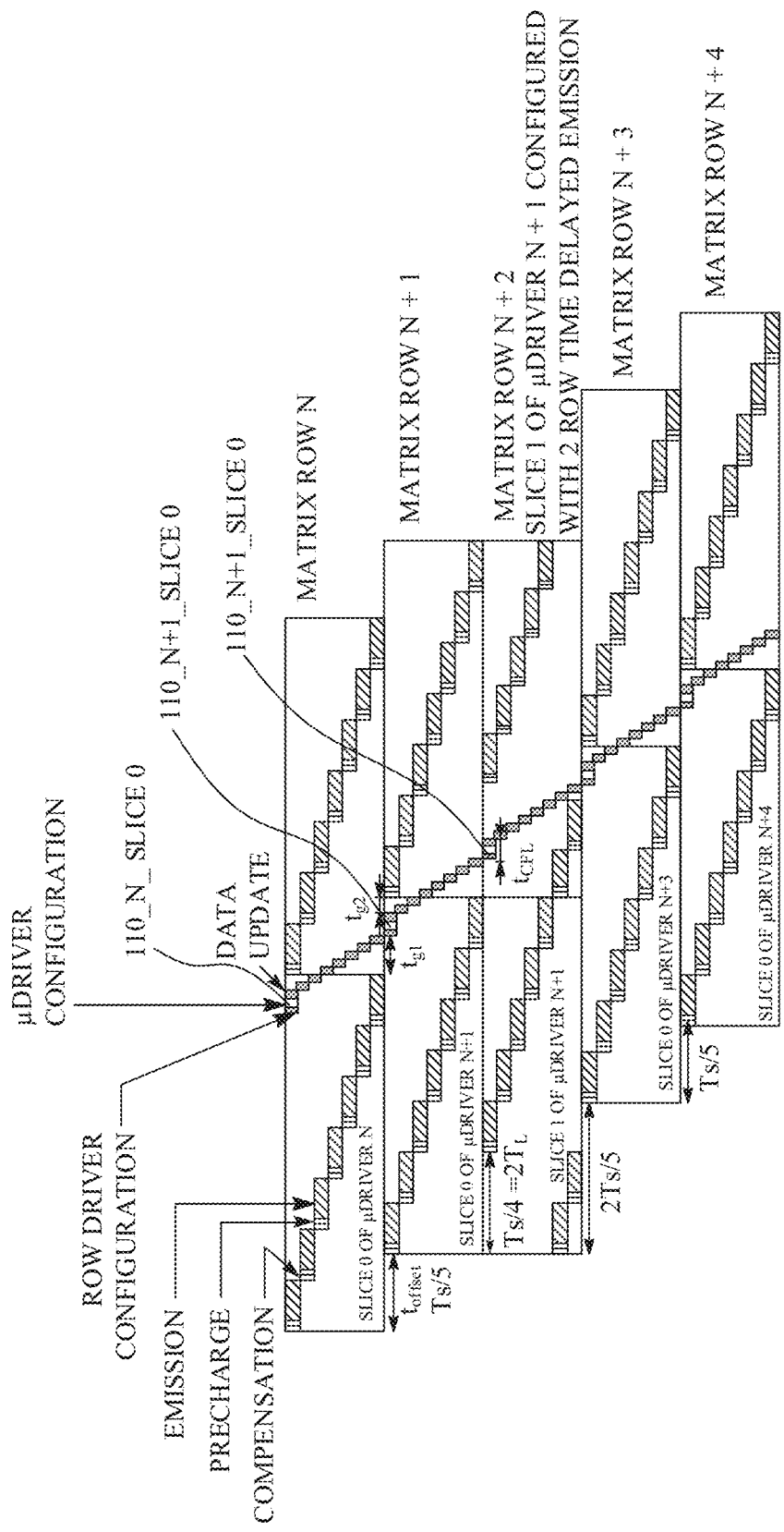
FIG. 10B is an illustration of timing gap margin for redundancy induced variation in accordance with the method of operating the local passive matrix display of FIG. 10A in accordance with an embodiment.

Referring now to FIGS. 10A-10B, when redundancy is preconfigured into the display, the timing gap margin changes, and induces an amount of variation. FIG. 10A is an illustration for a method of operating a local passive matrix display in accordance with an embodiment. FIG. 10B is an illustration of timing gap margin for redundancy induced variation in accordance with the method of operating the local passive matrix display of FIG. 10A. FIGS. 10A-10B may be understood as a master/slave configuration, in which slice 0 of each pixel driver chip 110 is by default active. As shown, at operation 1010 data update begins for pixel driver chip N+1 slice 0 for matrix row N+1. The data update is completed at operation 1020 for pixel driver chip N+1 slice 0 during emission of matrix row N+1. At optional operation 1030 the status is checked for pixel driver chip N+2 to determine whether the status is active or inactive. If the status of pixel driver chip N+2 is active, then at operation 1040 data update begins for pixel driver chip N+2 slice 0 during emission of matrix row N+1, and data update is completed at operation 1050 for pixel driver chip N+2 slice 0 during emission of matrix row N+2. If the status for pixel driver chip N+2 is inactive, then at operation 1042 date update begins for pixel driver chip N+1 slice 1 during emission of matrix row N+1, and date update is completed at operation 1052 for pixel driver chip N+1 slice 1 during emission of matrix row N+2.

In accordance with embodiments, checking the status of pixel driver chip N+1 is an optional operation, and is not necessarily performed in this sequence. For example, the pixel driver chips N, N+1 may be preconfigured based on testing during fabrication of the display so that operations 1040-1050, or 1042-1052 are automatically performed. Alternatively, operation 1030 may be performed during pixel driver configuration, with configuration clock 0, 1 signals 532, 544.

Still referring to FIG. 10B, where the status of pixel driver chip N+2 is inactive, and the method of operating the display includes delaying emission of a first emitter row of matrix row N+2, such that a time gap (tg2) between completing the data update for pixel driver chip N+1 slice 0 and starting emission of matrix row N+1 is less than a time gap (tg4) between completing the data update for pixel driver chip N+1 slice 1 and starting emission of matrix row N+2.

Figure 11A:
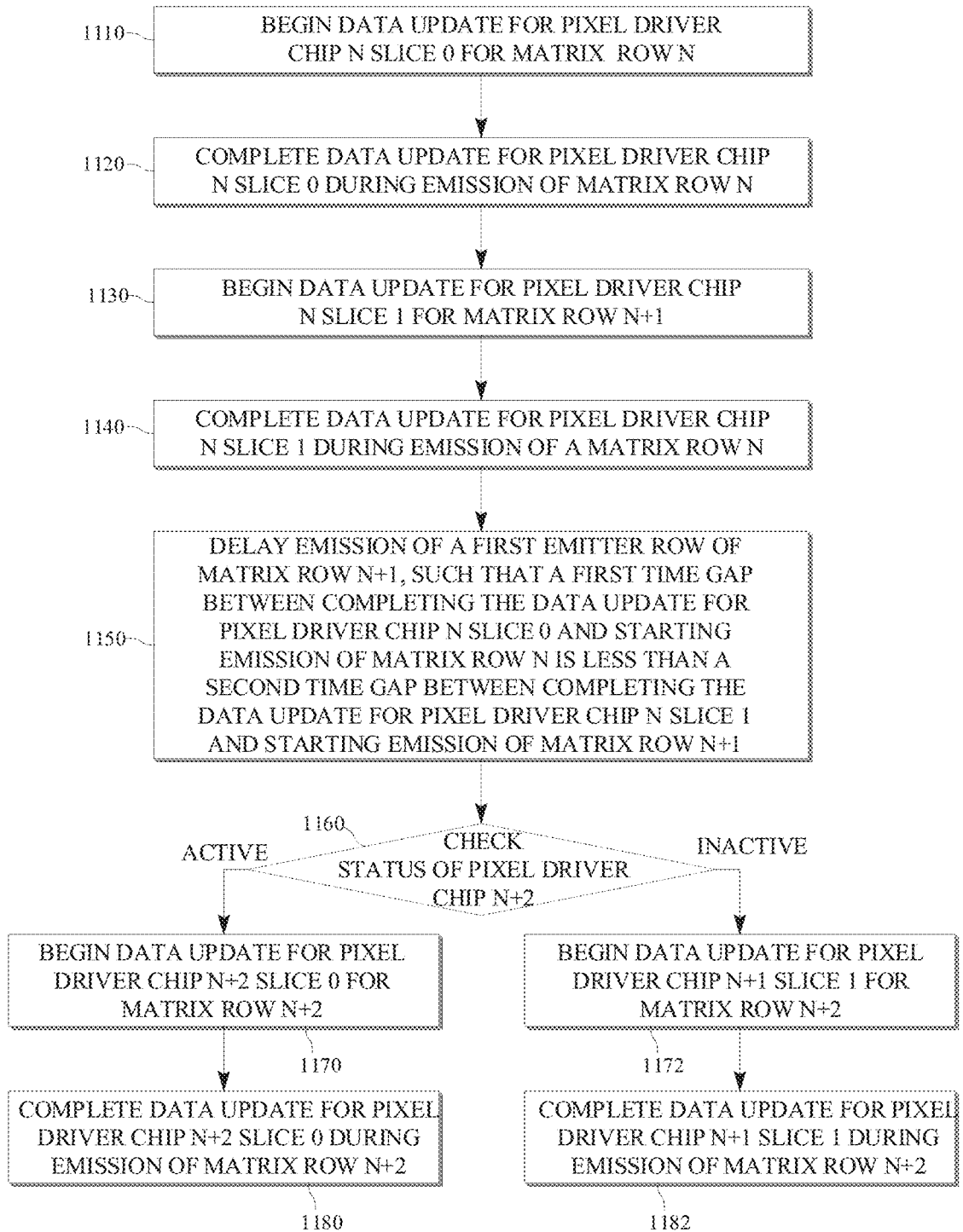
FIG. 11A is a diagram illustrating pixel driver chip data update and LED emission progression where primary pixel driver chips are active and redundant pixel driver chips are inactive by default in accordance with an embodiment.
Figure 11B:
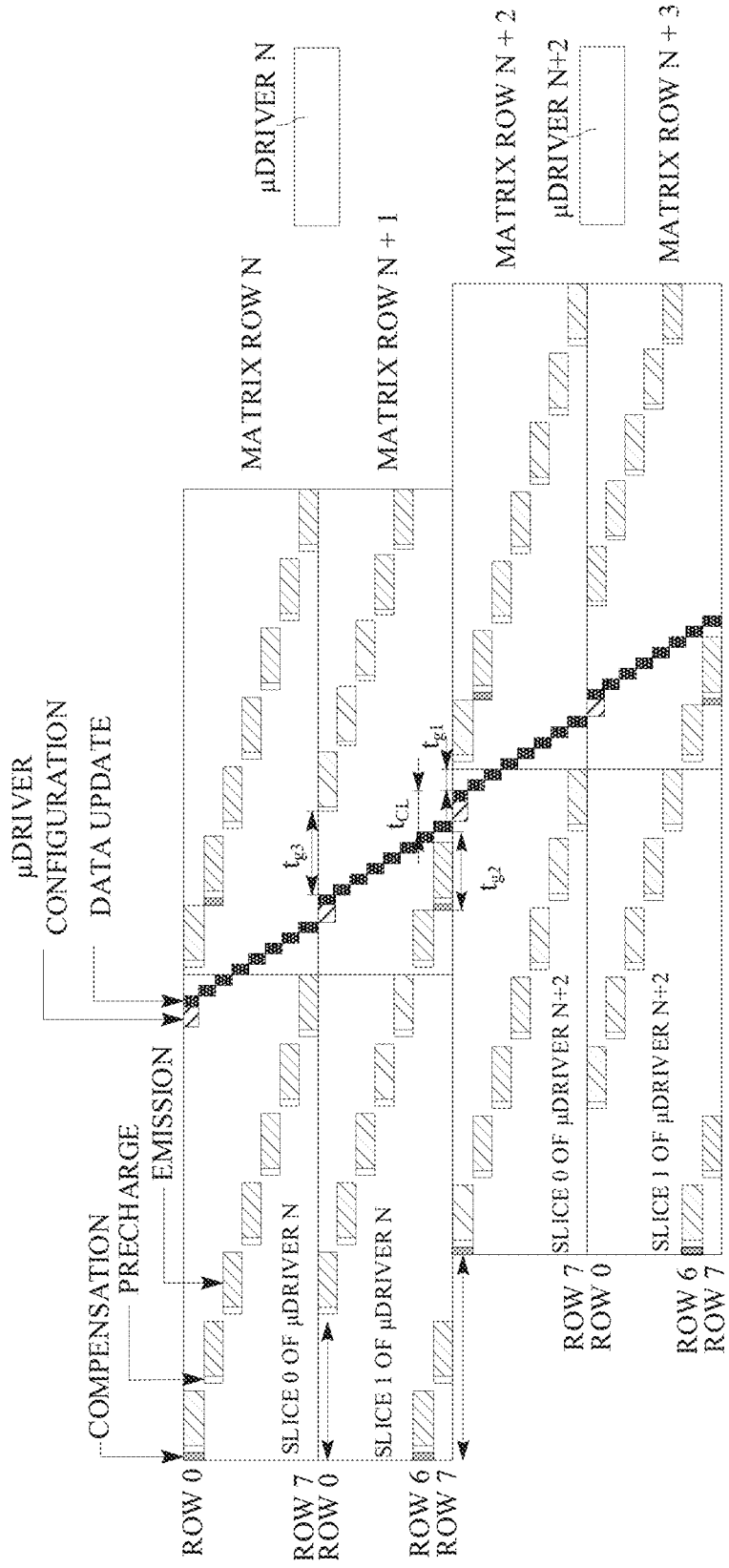
FIG. 11B is an illustration of timing gap margin for redundancy induced variation in accordance with the method of operating the local passive matrix display of FIG. 11A in accordance with an embodiment.

FIG. 11A is a diagram illustrating pixel driver chip data update and LED emission progression where primary pixel driver chips are active and redundant pixel driver chips are inactive by default in accordance with an embodiment. Thus, both slices 0, 1 for a primary pixel driver chip are active by default. FIG. 11B is an illustration of timing gap margin for redundancy induced variation in accordance with the method of operating the local passive matrix display of FIG. 11A. As shown, at operation 1110 data update begins for pixel driver chip N slice 0 for matrix row N. Data update is completed at operation 1120 for pixel driver chip N slice 0 during emission of matrix row N. At operation 1130 data update begins for pixel driver chip N slice 1 for matrix row N+1. Data update is completed at operation 1140 for pixel driver chip N slice 1 during emission of a matrix row N. As shown in FIG. 11B, at operation 1150 emission is delayed for a first emitter row of matrix row N+1, such that a time gap (tg1) between completing the data update for pixel driver chip N slice 0 and starting emission of matrix row N is less than a time gap (tg3) between completing the data update for pixel driver chip N slice 1 and starting emission of matrix row N+1.

Figure 11C:
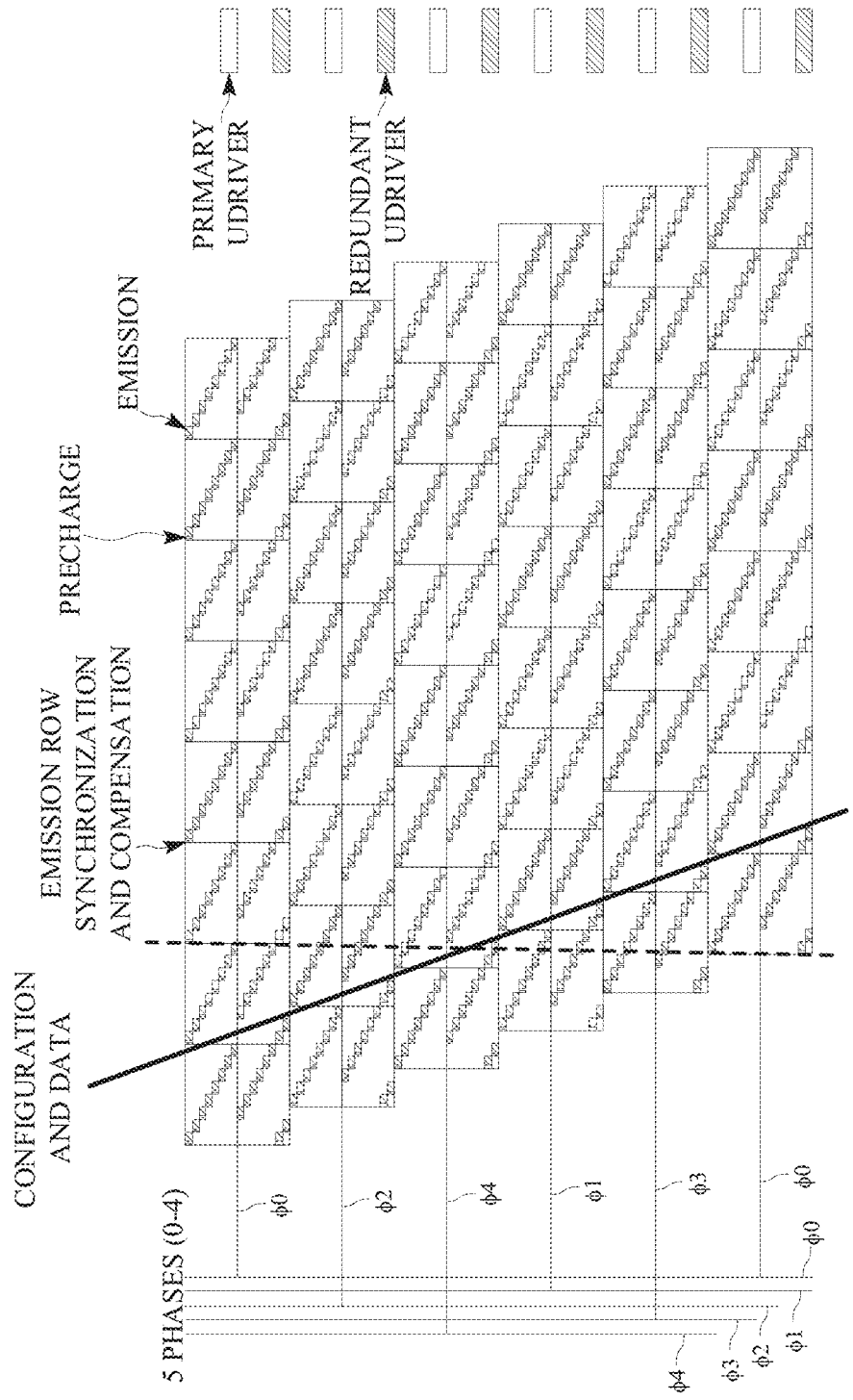
FIG. 11C is a diagram illustrating pixel driver chip data update and LED emission progression for a local passive matrix display in default mode in which every other row of pixel driver chips is a primary row, in which both portion or slices are active in accordance with an embodiment.
Figure 11D:
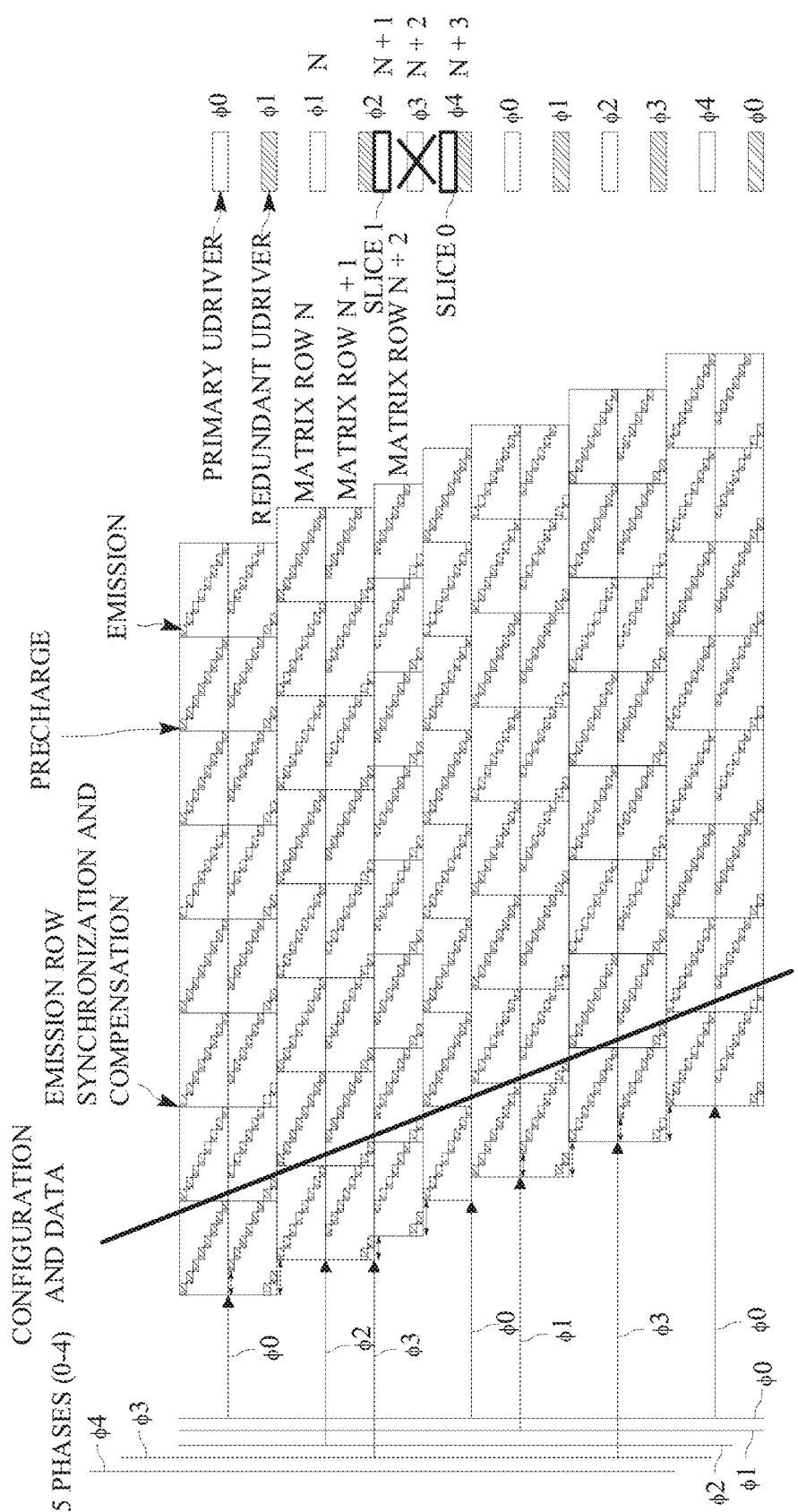
FIG. 11D is a diagram illustrating pixel driver chip data update and LED emission progression for a local passive matrix display including an inactive primary pixel driver chip in accordance with an embodiment.

Referring now to FIG. 11C a diagram is provided illustrating pixel driver chip data update and LED emission progression for a local passive matrix display in default mode in which every other row of pixel driver chips is a primary row, in which both portion or slices are active in accordance with an embodiment. In such an embodiment, every other row of pixel driver chips receives a separate phase, also staggered by every other phase. Thus, rows N, N+2, etc. receive phases 0, 2, etc. Referring now to FIG. 11D a diagram is provided illustrating pixel driver chip data update and LED emission progression for a local passive matrix display including an inactive pixel driver chip in accordance with an embodiment. In such an embodiment, two adjacent redundant pixel driver chips in rows N+1 and N+3 are programmed to take over the functionality of an inactive primary pixel driver chip in row N+2. As shown, the primary pixel driver chip originally designated to receive phase 4 is inactive. In this case, slice 1 of the above redundant pixel driver chip in row N+1 receives phase 3, while slice 0 of the below redundant pixel driver chip in row N+3 receives phase 0.

Referring again to FIG. 11A, in an embodiment, at operation 1160 the status is checked for pixel driver chip N+2 to determine whether the status is active or inactive. If the status of pixel driver chip N+2 is active, then at operation 1170 data update begins for pixel driver chip N+2 for matrix row N+2, and data update is completed at operation 1180 for pixel driver chip N+2 slice 0 during emission of matrix row N+2. If the status for pixel driver chip N+2 is inactive, then at operation 1172 date update begins for pixel driver chip N+1 slice 1, and date update is completed at operation 1182 for pixel driver chip N+1 slice 1 during emission of matrix row N+2. In accordance with embodiments, checking the status of pixel driver chip N+2 is an optional operation, and is not necessarily performed in this sequence. For example, the pixel driver chips may be preconfigured based on testing during fabrication of the display so that operations 1170-1180, or 1172-1182 are automatically performed. Alternatively, operation 1160 may be performed during pixel driver configuration, with configuration clock 0, 1 signals 532, 544.

Figure 12:
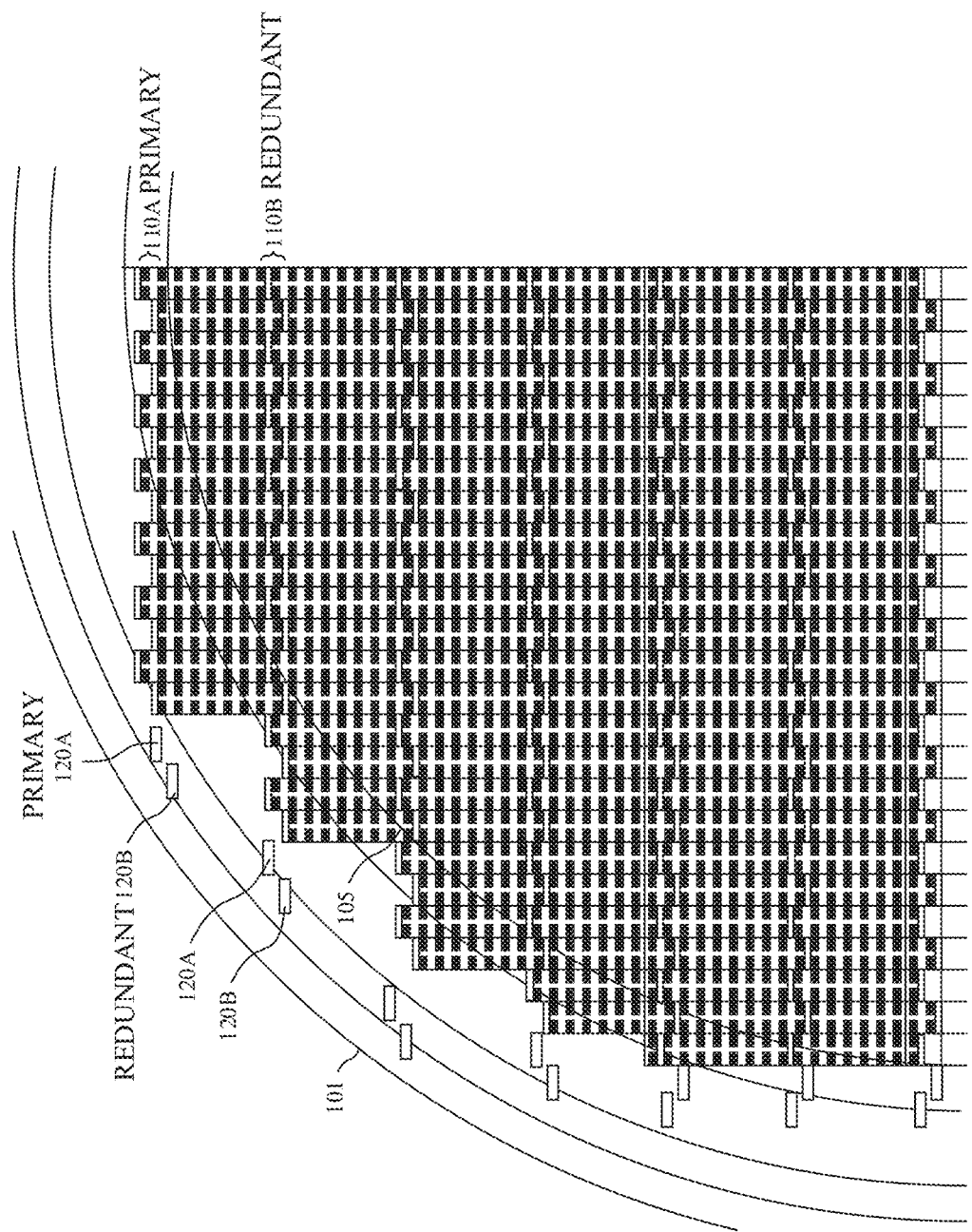
FIGS. 12-14 are schematic top view illustrations of arrangements of pixel driver chips and row driver chips for displays with curved display areas in accordance with embodiments.
Figure 13:
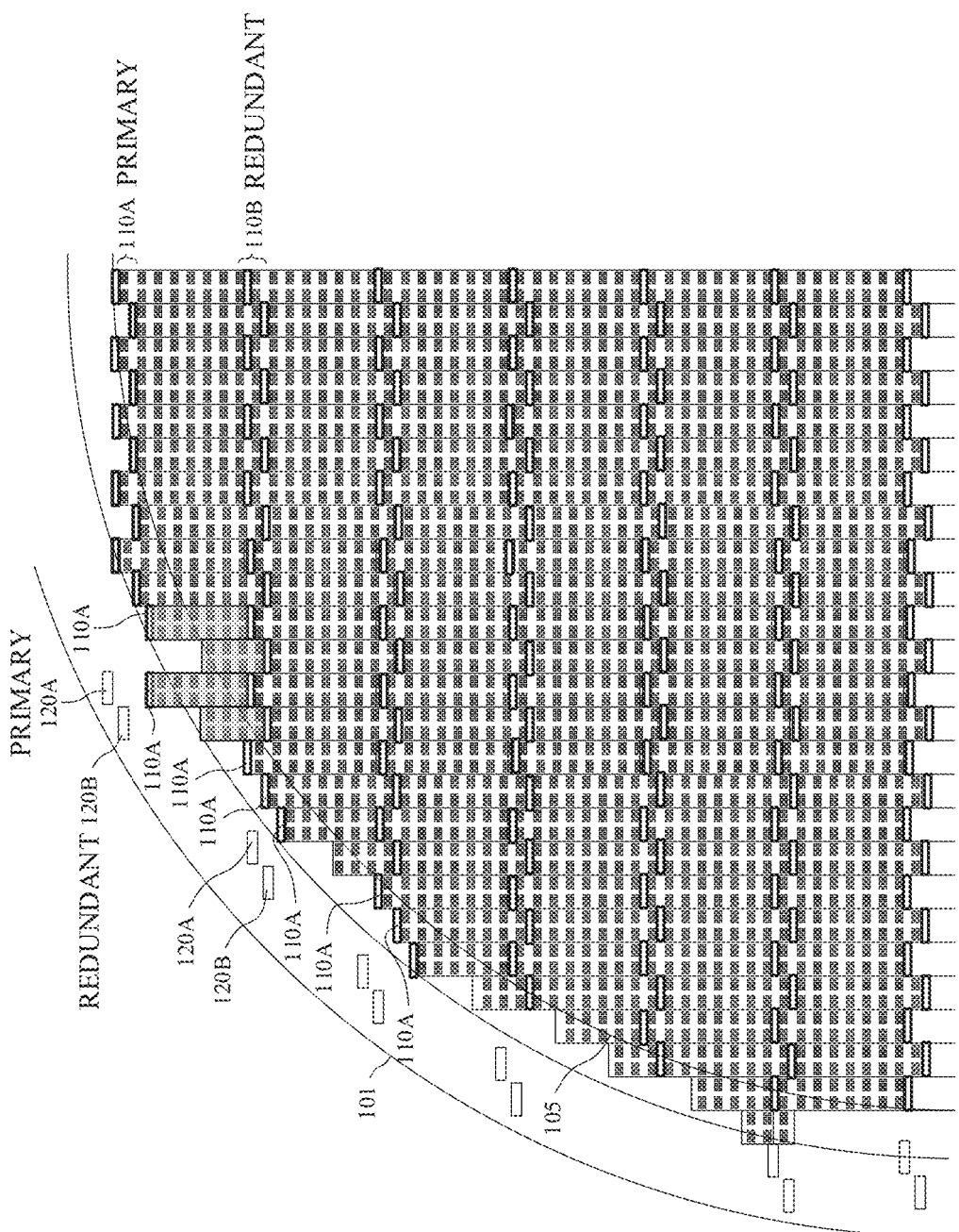
Figure 14:
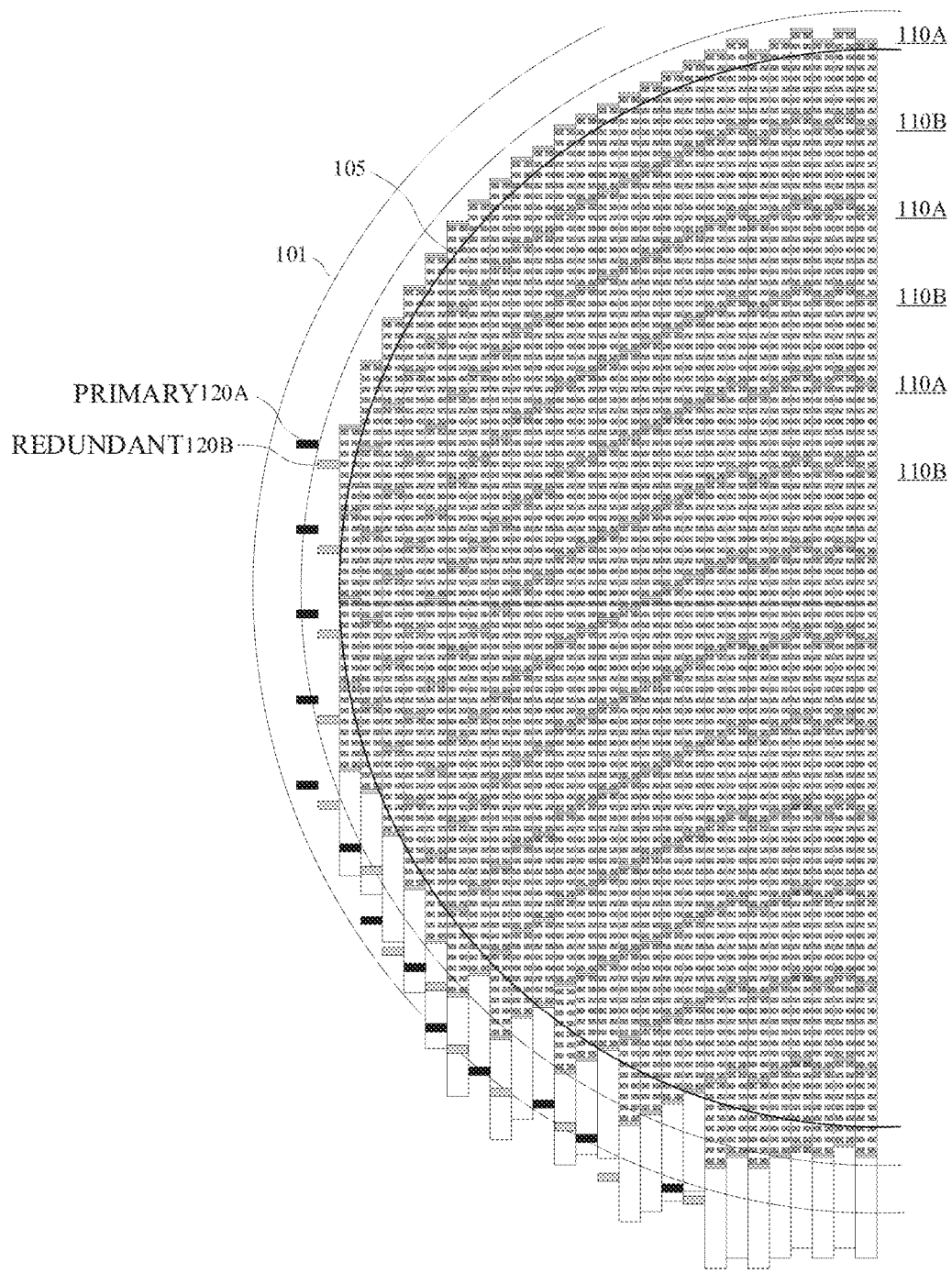

Referring now to FIGS. 12-14 schematic top view illustrations of arrangements of pixel driver chips and row driver chips for displays with curved display areas 105 in accordance with embodiments. In the embodiments illustrated in FIGS. 12-13, the pixel driver chips are arranged in rows in lines across the display substrate 101. For example, the rows may be primary pixel driver chips 110A, and redundant pixel driver chips 110B. The rows may also be staggered, in a zigzag pattern. In an embodiment, redundant pairs of row driver chips 120A, 120B may be located adjacent the rows of pixel driver chips outside of the display area 105. Thus, the row driver chips 120A, 120B may be located in a border area, or ledge area between edges of the display area 105 and display substrate 101.

In the embodiment illustrated in FIG. 12, a regular pitch of pixel driver chips is illustrated, where full rows of primary pixel driver chips 110A remain by default, the primary controllers. FIG. 13 illustrates a variation, in which rows of primary pixel driver chips 110A are irregularly arranged around the edge of the curved display area 105. In this manner, the display substrate border (e.g. distance between edges of display area 105 and display substrate 101) can be made slightly smaller with some amount of added routing complexity, and potentially luminance non-uniformity. In the embodiment illustrated in FIG. 14, the rows of pixel driver chips are arranged in curved patterned, with a row of primary pixel driver chips 110A curved along (e.g. just outside) the display area 105 of the display substrate 101.

Figure 15:
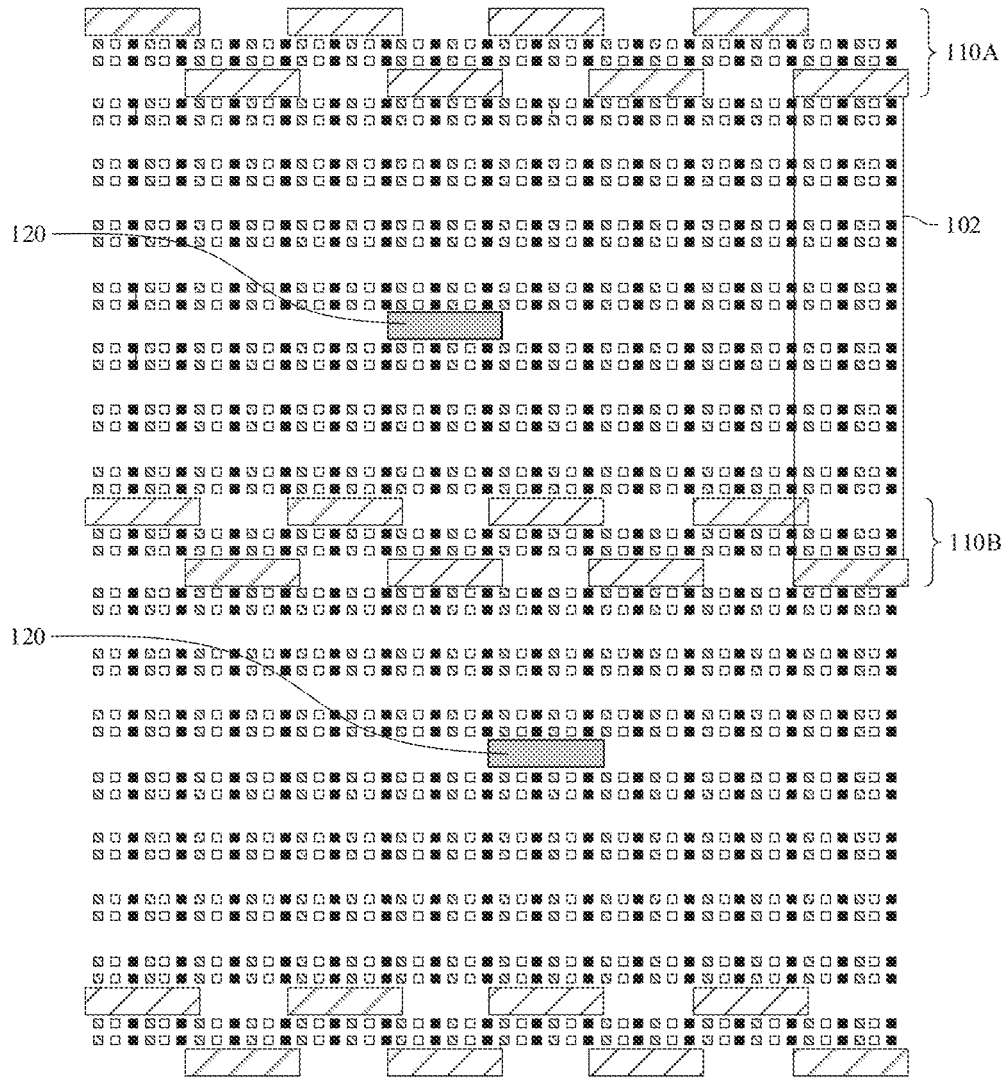
FIG. 15 is schematic top view illustration of a local passive matrix display including distributed row drivers in accordance with an embodiment.

Up until this point embodiments have been described in which row driver chips 120 are arranged at edges of the display area 105, and along the rows of pixel driver chips 110. However embodiments are not so limited, and it is not necessary to arrange row driver chips outside of the display area 105. FIG. 15 is schematic top view illustration of a local passive matrix display including distributed row driver chips 120 within the display area 105 of a display substrate 101 in accordance with an embodiment. As shown, the distributed row driver chips 120 are distributed among the pixel driver chips 110, and LED matrices 102. In accordance with embodiments, each distributed row driver chip 120 may control a plurality of pixel driver chips 110, and may control multiple rows of pixel driver chips 110. In an embodiment, the distributed row driver chips 120 are mounted on the display substrate 101 laterally between rows of LEDs. It is not required that the row driver chips 120 be mounted on the same surface as the LEDs, or between the LEDs. In accordance with all embodiments described herein the row driver chips may also be located within the display substrate, and may be positioned face up (e.g. with terminals facing up towards the LEDs), positioned face down (e.g. with terminals facing away from the LEDs), or both (with terminals on both top and bottom sides). Thus, where the row driver chips are described herein as being distributed about a display area, or interspersed with a display area, it is understood the row driver chips may be on the display substrate (e.g. surface mounted) or embedded within the display substrate similarly as the pixel driver chips 110.

Figure 16:
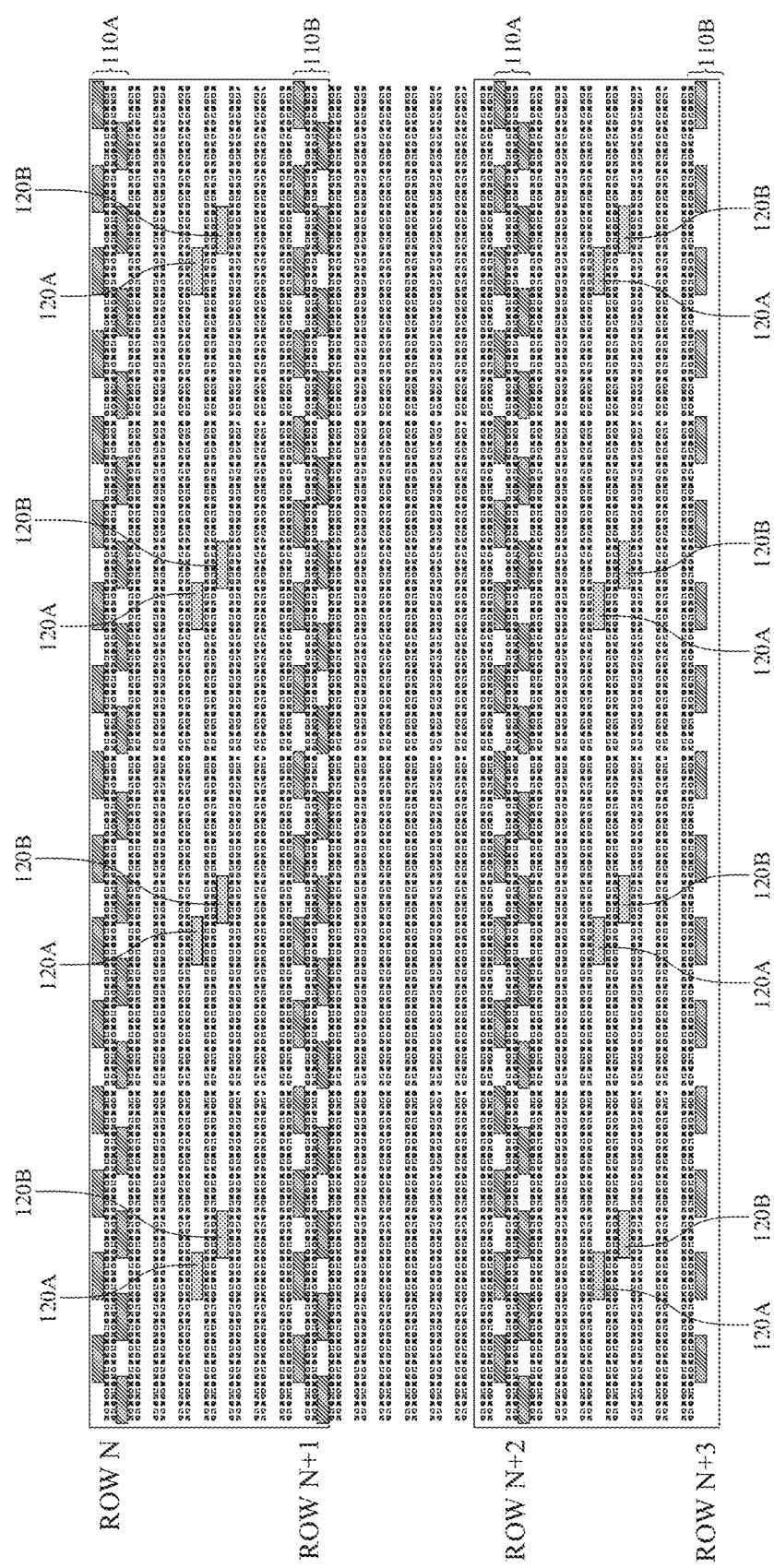
FIG. 16 is schematic top view illustration of a local passive matrix display including redundant distributed row drivers in accordance with an embodiment.

FIG. 16 is schematic top view illustration of a local passive matrix display including redundant distributed row driver chips in accordance with an embodiment. Similar to LED redundancy, and pixel driver chip 110 redundancy, this redundancy may be extended to the distributed row driver chips 120, including primary distributed row driver chips 120A, and corresponding redundant distributed row driver chips 120B. For example, the primary distributed row driver chips 120A may be default active, while the redundant distributed row driver chips 120B are by default inactive, and only become active if a corresponding primary distributed row driver chip is inactive. In the particular embodiment illustrated in FIG. 16, each pair of distributed pixel driver chips 120 (120A, 120B) controls a plurality of pixel driver chips 110. Additionally, the distributed row driver chips are distributed between rows of pixel driver chips, at an interval of every other row of pixel driver chips. In this manner, each row of distributed row driver chips 120 (120A, 120B) can control corresponding rows of primary pixel driver chips 110A and redundant pixel driver chips 110B.

In one aspect, the integration of distributed row driver chips 120 in accordance with embodiments can facilitate the reduction of border area for the display panel. Furthermore, the removal of driver ledges commonly reserved for row drivers can facilitate the integration of tiled displays. In addition, since the distributed row driver chips 120 are locally integrated, rather than along edges, this can add flexibility to shapes available for the display panel 101, as well as the integration of cutouts (e.g. holes) in the display area 105

Figure 17:
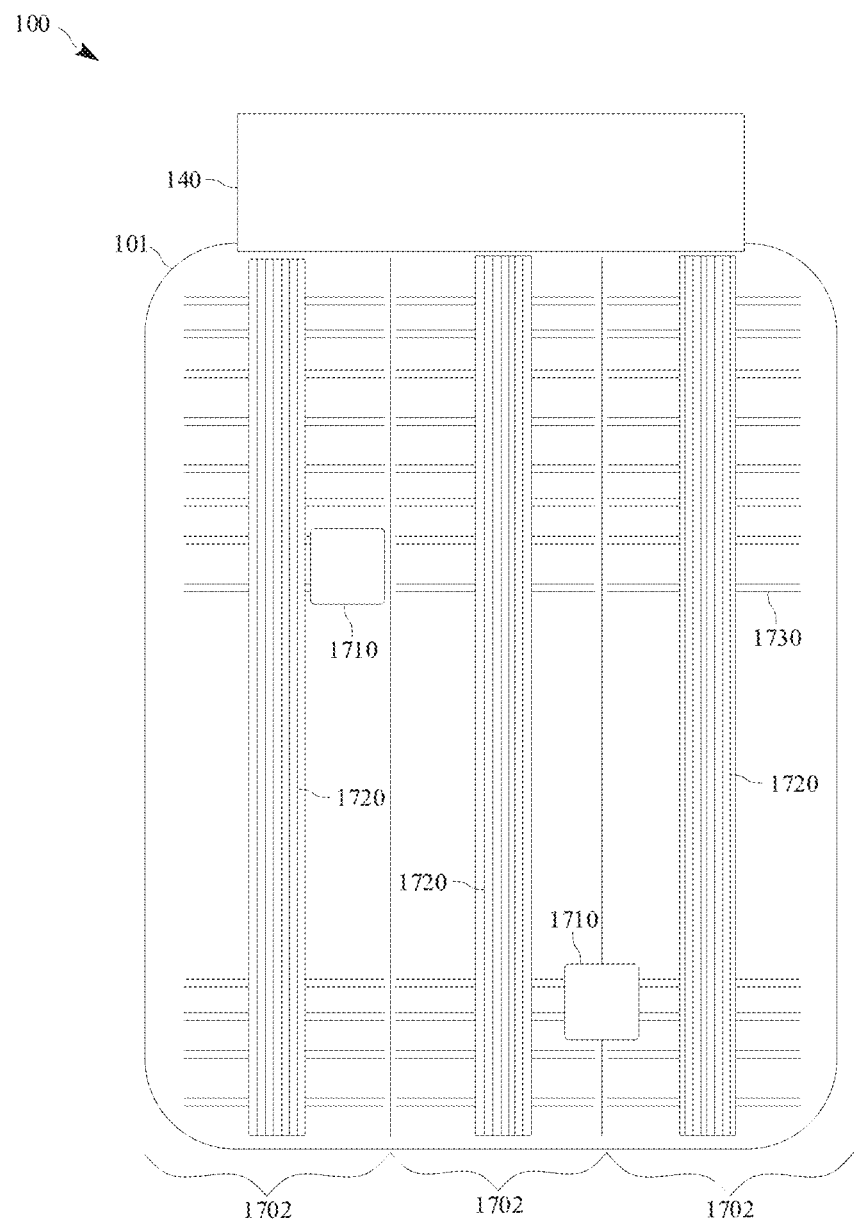
FIG. 17 is a schematic top view illustration of a tiled display with round corners and near zero border in accordance with an embodiment.

FIG. 17 is a schematic top view illustration of a tiled display in accordance with an embodiment. As illustrated, the local passive matrix tiled display 100 may include an external control circuit 140, and a plurality of tiles 1702 arranged side-by-side. Each tile 1702 may include a bus line 1720 running a length of the tile 1702, and a plurality of rows of signal line bundles 1730 extending from the bus line 1720 to a corresponding plurality of rows of row driver chip. The bus line 1720 (or backbone routing) in the middle of the tiles 1702 may enable round corners and near zero x and y-borders. As shown, the bus line 1720 for each tile 1702 may be coupled with the external control circuit 140. In an embodiment, the signal line bundles 1730 each include emission clock lines and data clock lines to a plurality of pixel driver chips. The bus lines 1720 may additionally include emission clock bus lines and data clock bus lines. Still referring to FIG. 17, the tiled display 100 may include a cutout 1710 in one of the tiles 1702, or even a cutout 1710 extending across multiple tiles 1702. Exemplary signal lines that may be included in the backbone routing, or bus line 1720, are base data clock 502, base configuration update 504, emission back clock (RGB) 510, VST0 512, VST1 514, VST scan clock 518, base emission row synchronization 506, base emission frame synchronization 508, row driver configuration clock, 590, and row driver configuration data 592. Data signal lines to the pixel driver chips may also be included in the bus line 1720, for example, data 550 lines, and partial update 560 lines.

Figure 18:
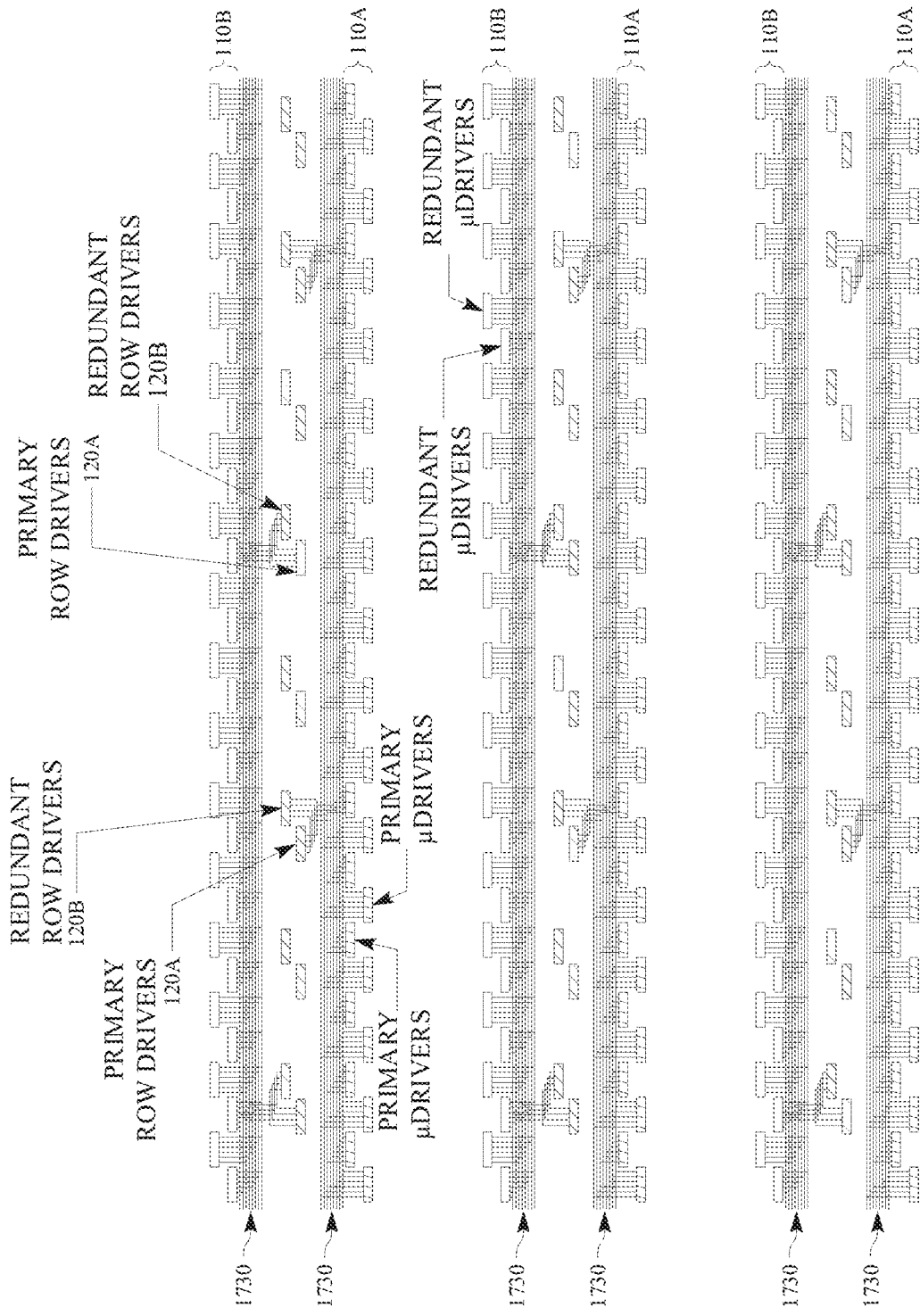
FIG. 18 is a detailed panel connection diagram illustrating row level data and emission control signal connections of a bundled signal line being driven by distributed row driver chips and pixel driver chips for a local passive matrix display in accordance with an embodiment.
Figure 19:
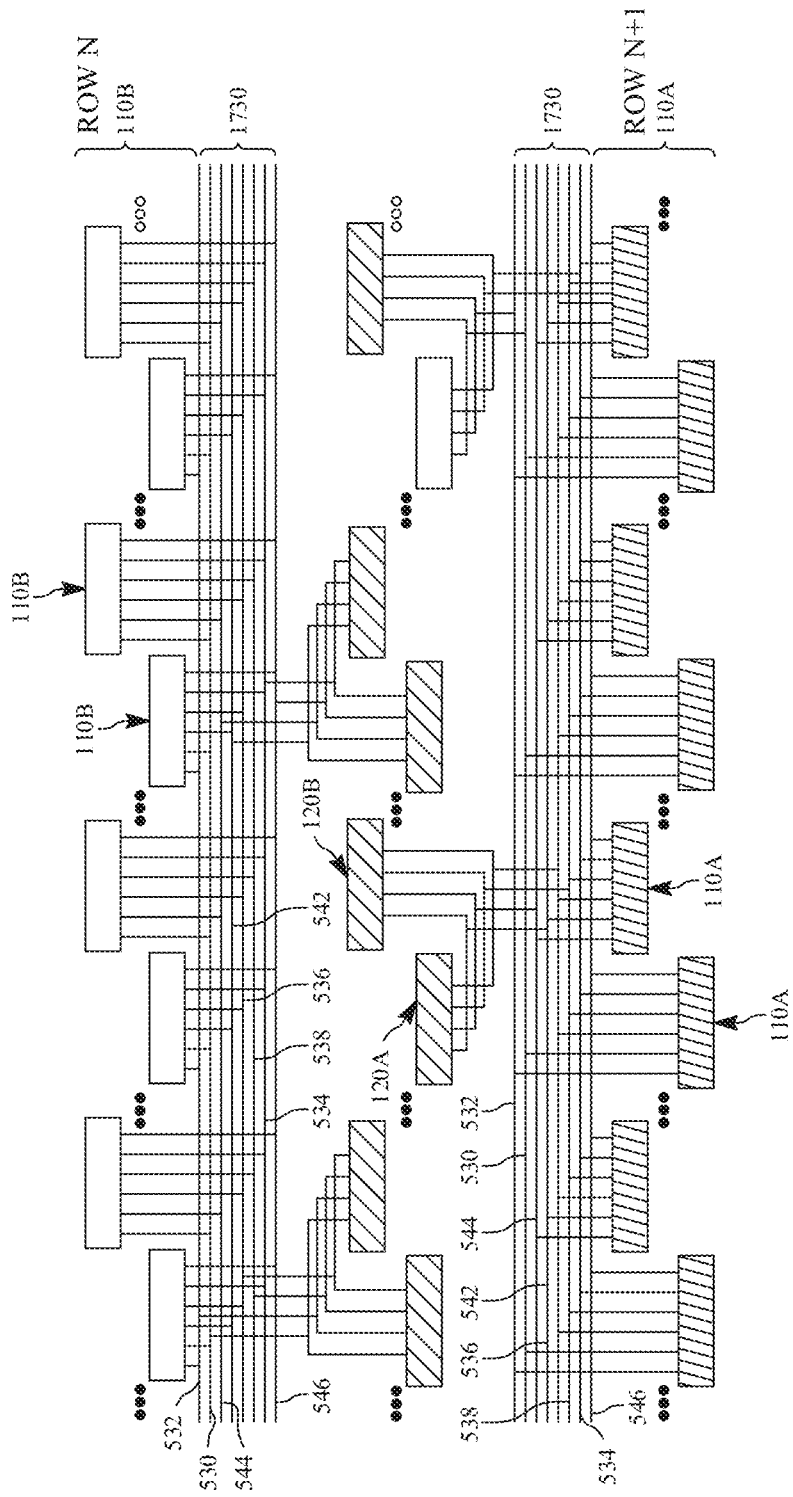
FIG. 19 is a close up illustration of the panel connection diagram of FIG. 18 in accordance with an embodiment.

Referring now to FIG. 18 a detailed panel connection diagram illustrating row level data and emission control signal connections within the bundled signal lines 1730 being driven by distributed row driver chips and pixel driver chips for a local passive matrix display in accordance with an embodiment. For example, the display may be a tiled display. FIG. 19 is a close up illustration of the panel connection diagram of FIG. 18 in accordance with an embodiment. In particular, the bundled signal lines 1730 of FIGS. 18-19 may extend from the bus lines 1720. As shown, each bundled signal line 1730 may couple with a corresponding row of pixel driver chips 110 (e.g. 110A or 110B). Additionally, each bundled signal line 130 may couple with a portion of the row driver chips 120 (e.g. 120A, 120B) between rows of pixel driver chips 110. In this manner, adjacent bundled signal lines 1730 each couple with separate portions of row driver chips 120 between the adjacent bundled signal lines 1730. Thus, a first portion of the distributed row driver chips 120 (e.g. 120A, 120B) operate the pixel driver chips 110 (e.g. 110A or 110B) connected to a corresponding signal line bundle 1730, and a second portion of the distributed row driver chips 120, within the same row, operate the pixel driver chips 110 (e.g. 110A or 110B) connected to a second corresponding signal line bundle 1730. In the embodiment illustrated, the first portion of distributed row driver chips 120A, 120B operate the primary pixel driver chips 110A in row N, while the second portion of distributed row driver chips 120A, 120B operate the redundant pixel driver chips 110B in row N+1.

While not exhaustive, FIG. 19 provides an illustration for a collection of signal lines that may be included with the signal line bundles 1730 in accordance with embodiments. As shown, exemplary signal lines include configuration clock_0 532 signal line, data clock_0 530 signal line, configuration clock_1 544 signal line, data clock_1 542 signal line, emission frame synchronization 536 signal line, emission clock_0 538 signal line, emission clock_1 546 signal line, and emission row synchronization 534 signal line. As shown, the first portion of row driver chips 120A, 120B coupled with row N of the redundant pixel driver chips 110B receive emission clock 0, 1538, 546 signals for the whole row N, emission frame synchronization 536 signals for the whole row N, and emission row synchronization 534 signals for the whole row N. The first portion of the row driver chips 120A, 120B additional receives data clock_1 542 signals and configuration clock_1 544 signals for the lower half of the row driver chips 110A in Row N. The first portion of the row driver chips 120A, 120B additionally receives data clock_0 530 and configuration clock_0 532 signals for the upper half of the row driver chips 110A in Row N. Connections with the next signal line bundle 1730, and Row N+1 of pixel driver chips 110B are connected similarly.

In an embodiment, a local passive matrix display 100 includes a first pixel driver chip arranged in a first row of pixel driver chips (e.g. 110A), a second pixel driver chip arranged in a second row of pixel driver chips (e.g. 110B), and a plurality of primary row driver chips 120A distributed in a row between the first and second rows of pixel driver chips. A first portion of the primary row driver chips 120A may be to operate the first row of driver chips, and a second portion of the primary row driver chips may be to operate the second row of pixel driver chips. In an embodiment, the first portion of the primary row driver chips is coupled to a first emission clock line (e.g. 538, 546 top row N) and a first data clock line (e.g. 530, 542 top row N), and the second portion of primary row driver chips is coupled to a second emission clock line (e.g. 538, 546 bottom row N+1) and a second data clock line (e.g. 530, 542 bottom row N+1). As sown in FIG. 17, the first and second emission clock lines are coupled to an emission clock bus line, and the first and second data clock lines are coupled to a data clock bus line within bus line 1720. Referring again to FIG. 19, a plurality of redundant row driver chips 120B can also be distributed in the row between the first and second rows of pixel driver chips. Similarly, a first portion of the redundant row driver chips is coupled to the first emission clock line (e.g. 538, 546 top row N) and the first data clock line (e.g. 530, 542 top row N), and a second portion of the redundant row driver chips is coupled to the second emission clock line (e.g. 538, 546 bottom row N+1) and the second data clock line (e.g. 530, 542 bottom row N+1).

Figure 20:
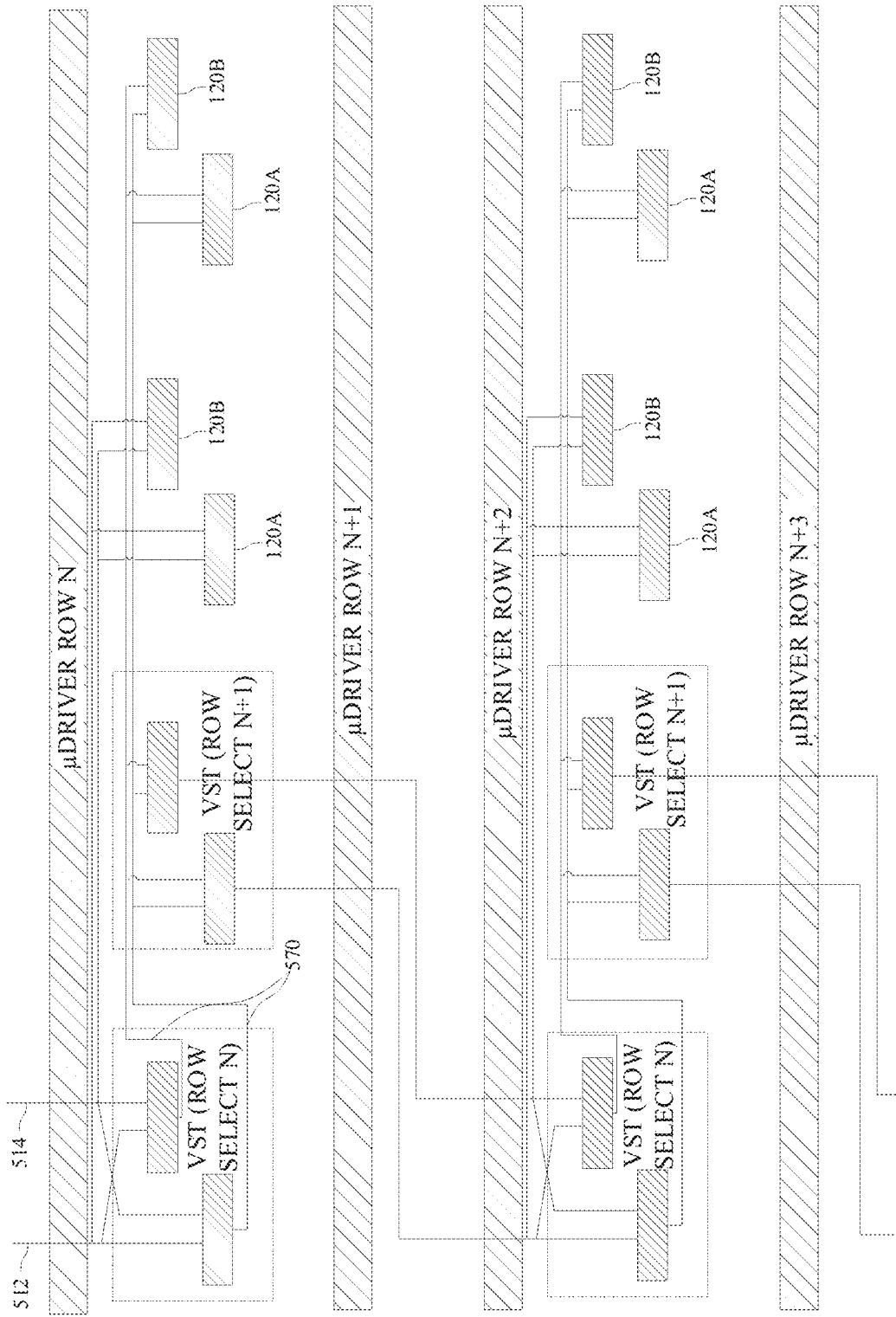
FIG. 20 is a panel connection diagram for propagation of a row select token to distributed row driver chips in accordance with an embodiment.

Referring now to FIG. 20 a panel connection diagram is provided to illustrate propagation of row selection token allowing data update for the selected line through the shared data lines in accordance with an embodiment. The cascaded redundant pairs of row driver chips 120A, 120B form a shift register allowing the row selection token (VST signal) to propagate through one row at a time. The row driver chip that holds the token, provides the data and configuration clock to its associated row of pixel driver chips for data and configuration update. Comparing FIG. 20 to FIG. 19, The first pair of row drivers 120A, 120B control the pixel driver chips (uDriver chips) of row N, while the next pair of adjacent row drivers 120A, 120B control pixel driver chips of row N+1, and so forth.

Up until this point LPM display configurations have been described in which the number of rows and columns driven per pixel driver chip and/or LPM tile is the same for each color of LED. However, this is not required, and embodiments may also differentiate the number of rows and columns of LEDs that are driven per color. As LPM puts additional requirements on the LEDs due to time sharing in the row direction, it can be beneficial in accordance with embodiments to differentiate in the amount of time sharing in the row (or column) direction between the different colored LEDs. This way the requirements can be relaxed for lower performing color, while the most economical LPM tile size can still be used.

As an example, for μLED green and blue subpixels an exemplary LPM tile size of 32 rows and 64 columns can be used, while for μLED red subpixels an exemplary 16 rows and 128 columns are used. As the total number of subpixels per tile for all three colors is the same, this combination can be routed in the backplane as one tile with the same size for all three colors. For example, such layouts may be beneficial for use with red μLEDs in a RGB μLED display, or blue LEDs in a RGB OLED display, as these colors can be generally lower performing than the other colors.

An important different between direct-drive and LPM is the shorter emission time per LED and the resulting higher brightness during emission that is needed to get an equal brightness level for the user. At low brightness levels this is not a big difference, as total emission time used is typically low and/or the current used for emission is typically low. At higher brightness levels this can be a significant difference, where depending on peak brightness and other display and driving parameters, the most extreme difference can be a 8× higher current level to the µLEDs for the 8× LPM case compared to direct-drive. This not only creates higher peak currents, but can also extend the total current range needed to drive the µLEDs.

In order to extend the advantage of LPM over direct-drive, it may be beneficial to increase the LPM tile size, while keeping it roughly square in size (i.e. the number of sub pixel columns is of the same order as the number of sub pixel rows in a LPM tile). Possible advantages of increasing the LPM size include lower cost as the total silicon area needed for one pixel driver chip is lower, lower total number of contacts to be made between the µLEDs and the pixel driver chips, and pitch of the contacts on the pixel driver chips. This makes contacting to the backplane wiring easier. However, when scaling the LPM tile to larger sizes, specifically when increasing the number of rows that are multiplexed in time, the LPM performance requirements for the µLEDs will also go up. Therefore, there can be a limit to the scaling of the LPM tile size set by the performance of the µLEDs that are used in the display. As performance of the colors used in the display (commonly red, green, blue) may not be equal, the color with the lowest performance may limit the size of the LPM tile.

In accordance with embodiments, performance may be addressed by differentiating the LPM tile size per color. Certain restrictions on the differentiation may include 1) total number of subpixels per LPM tile per color are be the same, and the number of rows per color per LPM tile for the colors with a smaller number of rows is an integer ratio of the largest number of rows used for a color in the LPM tile (e.g. 2× smaller, 3× smaller, etc). Both restrictions function to ensure that the differentiated LPM tile can be routed on the backplane as one tile for all colors.

Figure 21A:
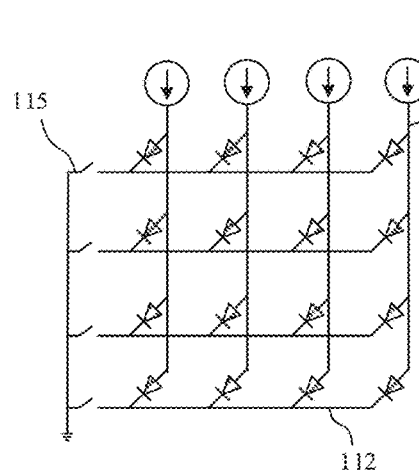
FIGS. 21A-21C are schematic layout views of local passive matrix configurations for various LED rows and columns to demonstrate the general differentiated local passive matrix tile size solution in accordance with embodiments.
Figure 21B:
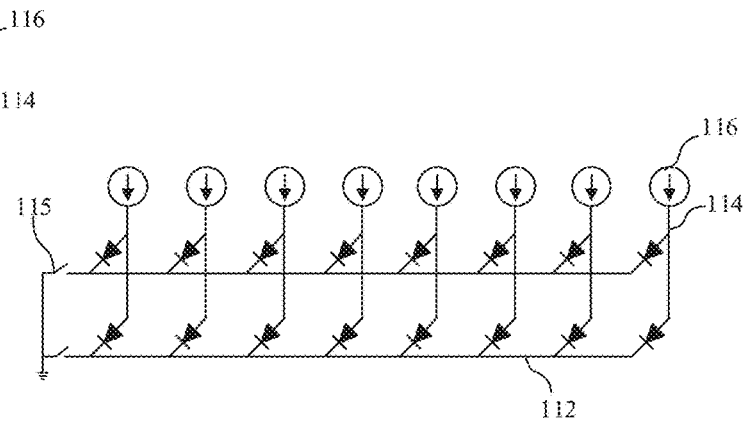
Figure 21C:
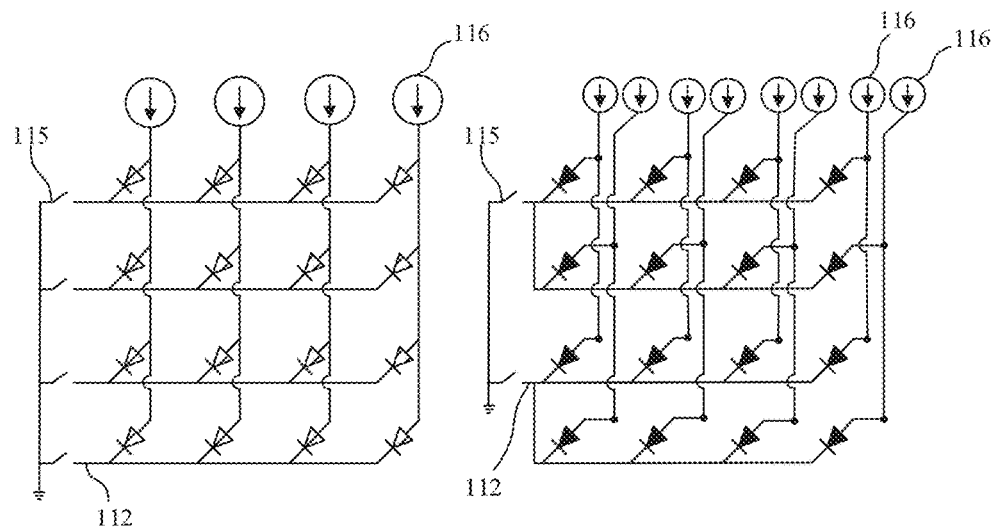

Referring now to FIGS. 21A-21C schematic layout views are provided of LPM configurations for various LED rows and columns to demonstrate the general differentiated LPM tile size solution in accordance with embodiments. For illustration purposes a small tile of only 16 LEDs is shown in FIGS. 21A-21C. FIG. 21A shows a configuration where the numbers of rows equals the number of columns. Such a configuration may require less driving circuitry, with less emission time available per LED. As shown, the configuration of FIG. 21A includes four output drivers 114, and four row-line switches 115 and level shifters. In a more realistic tile with many LEDs, this kind of configuration results in a large number of rows, which means the time available per row becomes short. In other words, more light needs to be generated in a shorter time, which can be detrimental for the reliability, especially for certain LED colors, such as blue OLED.

To provide more time for the blue LEDs, the number of rows can be reduced, as shown in FIG. 21B. As a result, the number of columns need to be increased proportionally to be able to drive the same amount of LEDs. The benefit is the increase emission time which is good for reliability, but the drawback is that more driving circuitry is required, because each column needs its own driving circuitry (e.g. output driver 116 for the current source), and this increases silicon cost.

An optimum trade-off between rows and columns can be different for different LED colors. Conventionally, all colors would be driven in one and the same configuration. The proposed differentiated LPM in accordance with embodiments changes that. Simply combining the two configurations of FIGS. 21A-21B is not possible because the physical tile sizes are different. FIG. 21C depicts how the blue elongated tile from FIG. 21B can be made similar to the red square tile, by a modified backplane routing. In this example, the number of logical rows for blue is half of red. This means that at any given moment two physical blue rows are emitting, while just one red row is emitting at any given moment in time (see FIGS. 22A-22B).

Figure 22A:
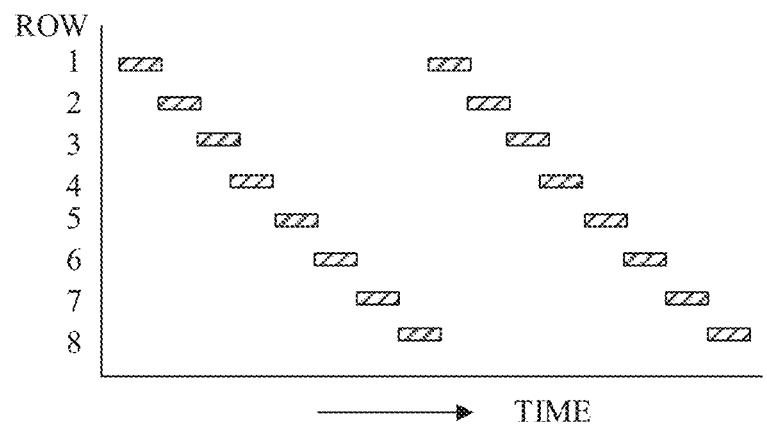
FIG. 22A is a timing diagram illustration for a red local passive matrix tile with eight rows in accordance with an embodiment.
Figure 22B:
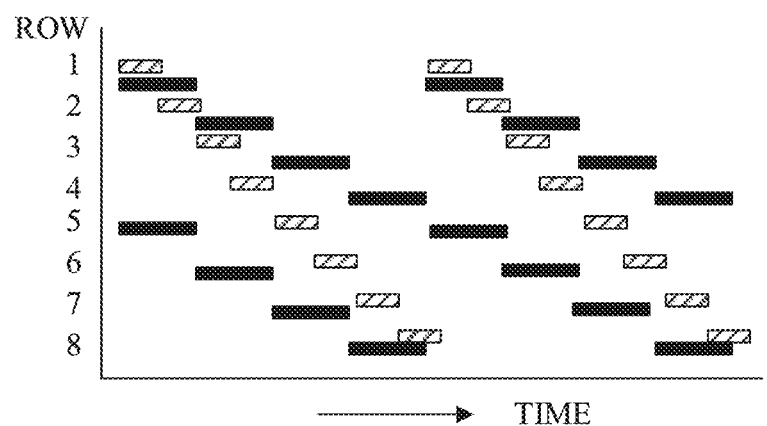
FIG. 22B is a timing diagram illustration for both red and blue local passive matrix tiles.
Figure 22C:
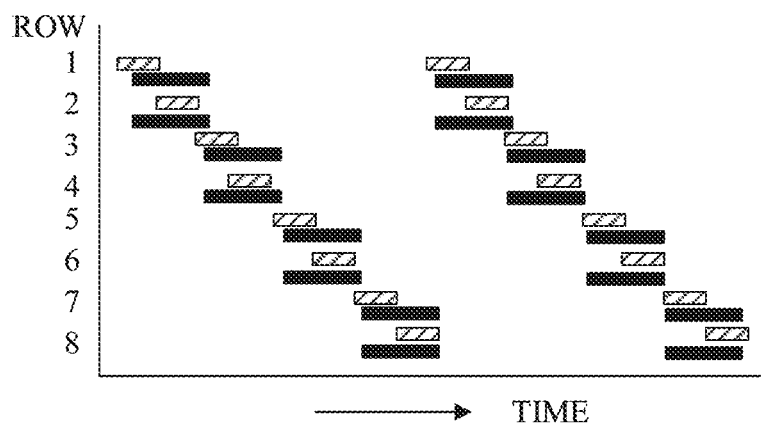
FIG. 22C is a timing diagram illustration in which two successive blue rows are emitting at the same time in accordance with an embodiment.

The timing diagram example illustrated in FIG. 22A is for a red LPM tile with 8 rows. The available emission time is ⅛th, with the red LEDs being driven at the ⅛th emission time. Which pair of blue rows should emit at the same time can be selected by changing the backplane routing. FIG. 22B is an illustration of a timing diagram example for both red and blue LPM tiles, which may be a sub-optimal solution. In this illustration blue is driven at ¼th emission time. Two blue rows emit at the same time. This can result in neighboring red and blue LEDs emitting at very different moments in time, which has the potential to produce image artifacts. A solution in accordance with embodiments is shown in FIG. 22C in which two successive blue rows are emitting at the same time. The timing diagram of FIG. 22C illustrates that the mismatch in emission timing red and blue is minimized. The timing diagram of FIG. 22C may be utilized for the configuration and backplane routing of FIG. 21C.

Figure 23:
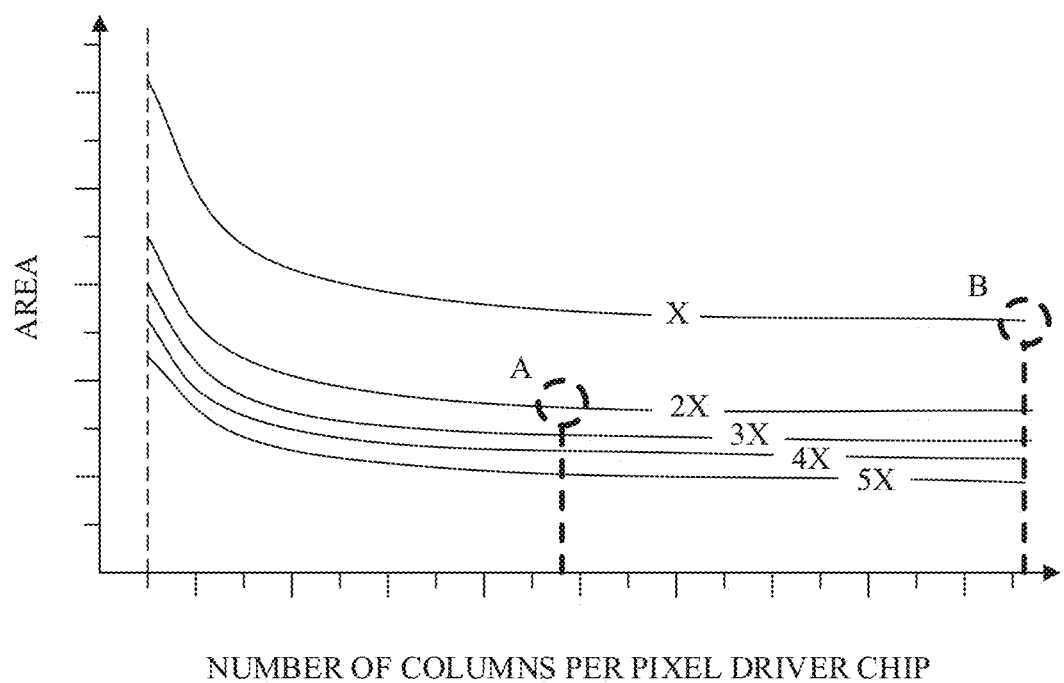
FIG. 23 a scaling graph illustration of the relationship of total silicon area needed for one display as a function of the number of columns in a tile for a number of choices of the number of rows (x) in a tile in accordance with an embodiment.

Referring now to FIG. 23 a scaling graph is provided to illustrate the relationship of total silicon area needed for one display as a function of the number of columns in a tile for a number of choices of the number of rows (x) in a tile. The total silicon area is the sum of the area per pixel driver chip in the display, where typically one pixel driver chip drives the pixels in one tile. It is clear that the total silicon area needed for a display is reduced when the number of rows (X) and columns in a tile is increased. In accordance with an embodiment, a point on one of the curves is chosen per color, such that the right balance between stress caused by the driving conditions (causing reduced lifetime) and pixel driver chip is reduced. As shown in FIG. 23, example A could be one choice within one LPM tile for certain colors (e.g. red and green), while example B could be another choice within the same LPM tile for other colors (e.g. blue). As the total number of subpixels for both choices are identical and the number of rows is 2× less in the blue example this combination could be implemented in one pixel driver chip and routed in one tile.

Figure 24:
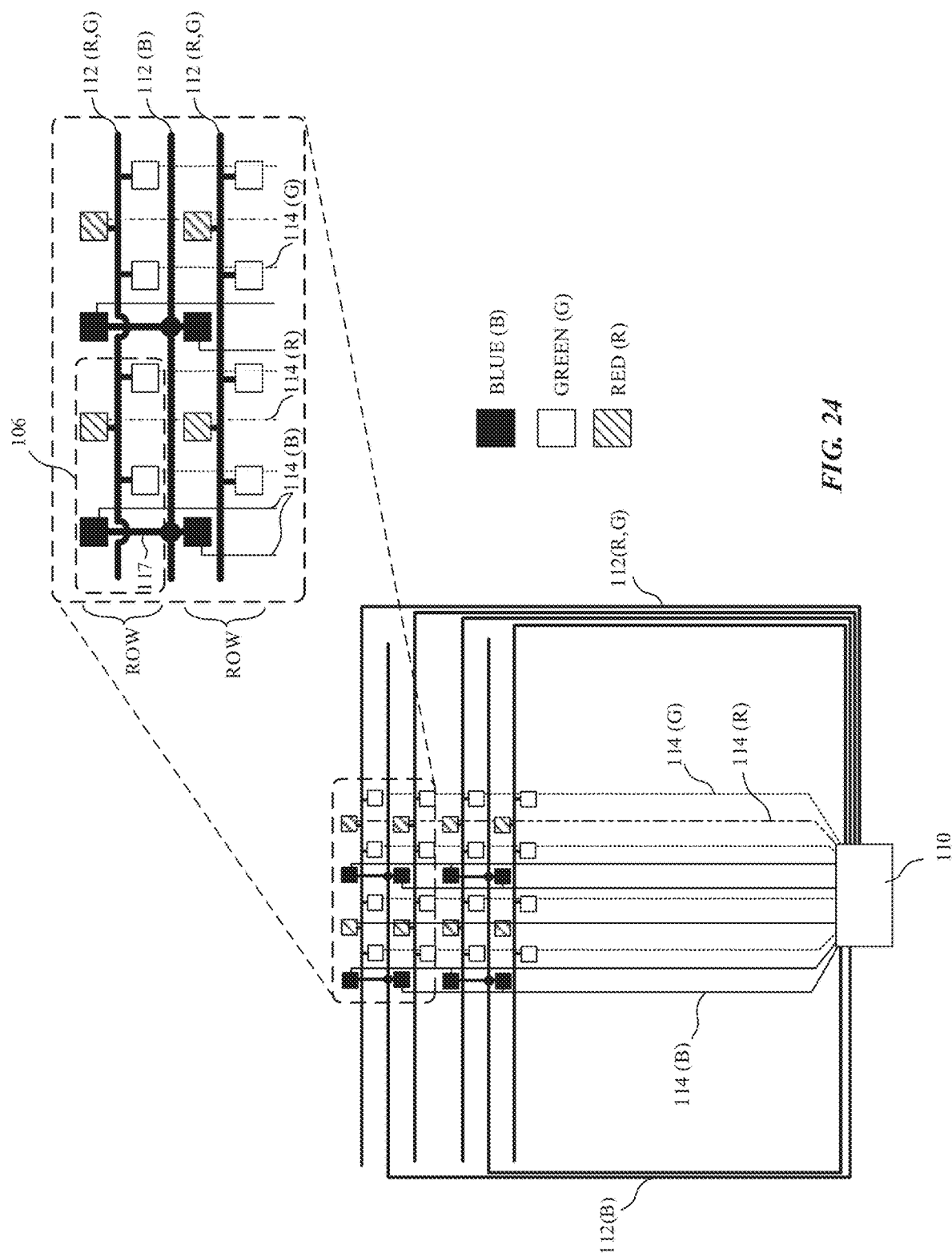
FIG. 24 is a schematic top view illustration of routing in a differentiated LPM tile in accordance with an embodiment.

FIG. 24 is a schematic top view illustration of routing in a differentiated LPM tile in accordance with an embodiment. This example follows the example of FIG. 23, where the blue tile routing has 2× fewer rows (interconnects 112(B)) compared to interconnects 112(G,R) and 2× more columns (interconnects 114(B)) compared to red and green tile routing (interconnects 114(R) and 114(G)). In order to route this in one LPM tile, the blue subpixels have their own row interconnect 112(B), while the red and the green subpixels share their row interconnects 112 (R,G). The blue sub pixels share one row connection 117 between two physical rows of subpixels (row connection is coupled with row interconnect 112(B)), while the red and the green subpixels have one row interconnect per physical row of sub pixels.

This way two blue physical rows of subpixels are selected at the same time, while this is not the case for the green and the red sub pixels. Further, the two physical rows of blue subpixels connected to one row have a double number of column interconnects 114. This way all the blue subpixels still get a unique video signal.

The arrangement shown in FIG. 24. is not the only possible way to route this. It is an exemplary illustration of a routing scheme in accordance with embodiments as the rolling row selection signal for the red, green and blue sub pixels is very closely aligned in time and location with the blue sub pixel row selection being 2× longer than the red and the green sub pixel row selection timing. The close timing and location minimizes the visible color break-up in the display.

It is also possible to have a similar routing where 3 physical rows of subpixels are all selected by one row signal, with 3× the amount of data signals going to the subpixels, etc. Further it is possible to have a unique row×column combination per color, for example 64×32 for green, 128×16 for blue and 256×8 for red. These combinations can all be routed together in one tile of 64×32 size. Further it is possible to choose other physical arrangements of the tile, such as 128×16 physical subpixels, where in the example above for green every physical row has 2 row electrodes and 2× less data lines. The optimal choice is determined by metal trace routing, electrical parameters like capacitance and resistance of the metal traces and optical performance (e.g. visual artifacts).

In addition to the aforementioned differentiated LPM configurations, it is also possible to use different pixel driver chips for colors with different LPM tile sizes, such as one set of pixel driver chips for red and another set for green and blue. This could give more freedom to choose the LPM tile sizes independently, although still the update sequence should be such that optical artifacts, such as color breakup are avoided. This may cost additional pixel driver chips and silicon area compared to the combined RGB pixel driver chip. Further it is possible to combine more than 3 primaries in the display, like RGBY. The same principles apply in those cases.

Referring now to FIG. 24 (with aid of FIGS. 1-2) in an embodiment, a local passive matrix display includes a plurality of pixel driver chips 110 interspersed within the display area 105 of a display substrate 101. A pixel driver chip 110 in the plurality of pixel driver chip is adjacent a corresponding plurality of pixels 106 arranged in a plurality of display rows. A first terminal 111 of the pixel driver chip 110 is coupled with a first group of LEDs of a first emission color (e.g. R) and a second group of LEDs of a second emission color (e.g. G) in a first display row. A second terminal 111 of the pixel driver chip 110 is coupled with a third group of LEDs of a third emission color (e.g. B) in the first display row.

In an embodiment, a third terminal 111 is coupled with a first column of LEDs (e.g. by interconnect 114(R)) of the first emission color (e.g. R), where the first column of LEDs overlaps the first group of LEDs. A further terminal 111 may be coupled with a second column of LEDs (e.g. by interconnect 114(G)) of the second emission color (e.g. G), where the second column of LEDs overlaps the second group of LEDs. A fifth terminal 111 may additionally be coupled with a third column of LEDs (e.g. by interconnect 114(B)) of the third emission color (e.g. B), where the third column of LEDs overlaps the third group of LEDs.

In an embodiment, a sixth terminal 11 of the pixel driver chip 110 may be coupled with a fourth group of LEDs of the first emission color (e.g. R) and a fifth group of LEDs of the second emission color (e.g. G) in a second display row, while the second terminal of the pixel driver chip is coupled with a sixth group of LEDs of the third emission color (e.g. B) in the second display row. As shown in FIG. 24, row connection 117 connects two physical rows of blue subpixels (row connection is coupled with row interconnect 112 (B)), In utilizing the various aspects of the embodiments, it would become apparent to one skilled in the art that combinations or variations of the above embodiments are possible for forming a local passive matrix display. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display comprising:
a vertical column of row driver chips including a plurality of groups of row driver chips, the plurality of groups of row driver chips including a first group of row driver chips and a second group of row driver chips; and
a vertical backbone routing including a plurality of emission base clock wirings connected with the vertical column of row driver chips, wherein the plurality of emission base clock wirings includes:
a first emission base clock wiring connected to a first row driver chip of the first group of row driver chips, wherein the first row driver chip includes an output to transmit a buffered first emission base clock repeat signal along a buffered first emission base clock repeat line to another row driver chip in the first group of row driver chips; and
a second emission base clock wiring connected to a second row driver chip of the second group of row driver chips, wherein the second row driver chip includes an output to transmit a buffered second emission base clock repeat signal along a buffered second emission base clock repeat line to another row driver chip in the second group of row driver chips.

2. The display of claim 1, further comprising an external control circuit, wherein the vertical backbone routing is coupled with the external control circuit.

3. The display of claim 2, comprising a plurality of vertical backbone routings (1720) and a plurality of vertical columns of row driver chips, wherein each backbone routing is coupled with the external control circuit and a corresponding vertical column of row driver chips.

4. The display of claim 1, further comprising:
a plurality of rows of pixel driver chips; and
a plurality of signal line bundles, each signal line bundle connected to a row driver chip of the vertical column of row driver chips and a row of pixel driver chips of the plurality of rows of pixel driver chips, wherein each signal line bundle includes a pixel driver chip emission clock routing.

5. The display of claim 4, wherein each pixel driver chip is coupled to a corresponding group of light emitting diodes (LEDs).

6. The display of claim 5, wherein the plurality of signal line bundles includes a first signal line bundle above a cutout, a second signal line bundle below the cutout, and a third signal line bundle adjacent the cutout, where the third signal line bundle is shorter than the first signal line bundle and the second signal line bundle.

7. The display of claim 1, further comprising a vertical column of spare row driver chips including a plurality of groups of spare row driver chips, the plurality of groups of spare row driver chips including a first group of spare row driver chips and a second group of spare row driver chips.

8. A display comprising:
- a vertical column of row driver chips including a plurality of pairs of row driver chips, each pair of row driver chips including a primary row driver chip and spare row driver chip;
- a vertical backbone routing including an emission base clock routing coupled with the vertical column of row driver chips;
- wherein the emission base clock routing is coupled to a first pair of row driver chips, and each of the first pair of row driver chips includes an output to transmit a buffered emission base clock repeat signal to another pair of row driver chips in the plurality of pairs of row driver chips;
- a plurality of horizontal rows of pixel driver chips; and
- a plurality of horizontal signal line bundles, each horizontal signal line bundle connected to a pair of row driver chips of the plurality of pairs of row driver chips and a horizontal row of pixel driver chips of the plurality of horizontal rows of pixel driver chips, wherein each horizontal signal line bundle includes a pixel driver chip emission clock routing.

9. The display of claim 8, wherein each pixel driver chip is coupled to a corresponding group of light emitting diodes (LEDs).

10. The display of claim 9, wherein the plurality of horizontal signal line bundles includes a first signal line bundle above a cutout, a second signal line bundle below the cutout, and a third signal line bundle adjacent the cutout, where the third signal line bundle is shorter than the first signal line bundle and the second signal line bundle.

11. The display of claim 8, comprising a plurality of vertical backbone routings and a plurality of pairs of row driver chips.

12. The display of claim 8, wherein the emission base clock routing comprises:
- a first emission base clock wiring connected to the first pair of row driver chips; and
- a second emission base clock wiring connected to a second pair of row driver chips.

13. The display of claim 12, wherein:
- the first pair of row driver chips is part of a first group of row driver chips; and
- the second pair of row driver chips is part of a second group of row driver chips.

14. The display of claim 13, wherein the first emission base clock wiring is to operate the first group of row driver chips with a first clock phase, and the second emission base clock wiring is to operate the second group of row driver chips with a second clock phase different from the first clock phase.

* * * * *